United States Patent
Zhai

(10) Patent No.: US 10,867,539 B2
(45) Date of Patent: Dec. 15, 2020

(54) DISPLAY MODULE, DISPLAY METHOD, AND DISPLAY DEVICE

(71) Applicant: Shanghai Tianma Micro-Electronics Co., Ltd., Shanghai (CN)

(72) Inventor: Yingteng Zhai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/729,922

(22) Filed: Dec. 30, 2019

(65) Prior Publication Data
US 2020/0342797 A1    Oct. 29, 2020

(30) Foreign Application Priority Data
Apr. 29, 2019  (CN) .......................... 2019 1 0356907

(51) Int. Cl.
 *G09G 3/36* (2006.01)
 *G09G 3/00* (2006.01)
 *G02F 1/29* (2006.01)
 *H01L 27/32* (2006.01)
 *G09G 3/3208* (2016.01)

(52) U.S. Cl.
CPC ............... *G09G 3/007* (2013.01); *G02F 1/29* (2013.01); *G09G 3/3208* (2013.01); *H01L 27/3216* (2013.01); *G09G 2300/0452* (2013.01); *G09G 2320/02* (2013.01); *H01L 27/3244* (2013.01)

(58) Field of Classification Search
CPC .......... G09G 3/36; G09G 3/20; G09G 3/3406; G09G 5/10; G09G 3/3208; G09G 3/3648; G09G 2320/0626
See application file for complete search history.

(56) References Cited

U.S. PATENT DOCUMENTS

| 5,414,541 A * | 5/1995 | Patel | G02F 1/13471 349/133 |
| 6,061,103 A * | 5/2000 | Okamura | G02B 27/017 345/32 |
| 6,243,055 B1 * | 6/2001 | Fergason | G02B 5/3083 345/32 |
| 7,042,535 B2 * | 5/2006 | Katoh | G02F 1/13363 348/E9.027 |

(Continued)

FOREIGN PATENT DOCUMENTS

CN   103123927 A   5/2013

*Primary Examiner* — Olga V Merkoulova
(74) *Attorney, Agent, or Firm* — Anova Law Group PLLC

(57) ABSTRACT

A display module includes a display panel including sub-pixels and a pixel shift unit at a side of a light-emitting surface of the display panel. For a sub-pixel, at a first time, the pixel shift unit does not shift the light emitted by the sub-pixel, and after the light emitted by the sub-pixel passing through the pixel shift unit, a first display pixel is formed corresponding to the sub-pixel, and at a second time, the pixel shift unit shifts the light emitted by the sub-pixel, and after the light emitted by the sub-pixel passing through the pixel shift unit, a second display pixel is formed corresponding to the sub-pixel. The second display pixel does not overlap the first display pixel. Orthographic projections of the second display pixel corresponding to the sub-pixel and a first display pixel of at least one adjacent sub-pixel overlap.

16 Claims, 17 Drawing Sheets

(56) References Cited

U.S. PATENT DOCUMENTS

| | | | |
|---|---|---|---|
| 7,106,389 B2* | 9/2006 | Katoh | G02F 1/1347 349/5 |
| 7,277,140 B2* | 10/2007 | Kurihara | H04N 9/3108 348/E5.141 |
| 8,861,063 B2* | 10/2014 | Matsuura | H04Q 11/0005 359/246 |
| 10,636,340 B2* | 4/2020 | Lu | G06F 3/013 |
| 2003/0132901 A1* | 7/2003 | Shimada | G09G 3/001 345/87 |
| 2013/0235444 A1* | 9/2013 | Matsuura | G02F 1/31 359/246 |
| 2015/0085228 A1* | 3/2015 | Kang | G02F 1/13363 349/98 |
| 2020/0033672 A1* | 1/2020 | Leister | G02F 1/13363 |
| 2020/0089061 A1* | 3/2020 | Wang | G02F 1/133636 |

* cited by examiner

DISPLAY MODULE, DISPLAY METHOD, AND DISPLAY DEVICE

CROSS-REFERENCES TO RELATED APPLICATION

This application claims the priority of Chinese Patent Application No. 201910356907.4, filed on Apr. 29, 2019, the content of which is incorporated herein by reference in its entirety.

TECHNICAL FIELD

The present disclosure generally relates to the field of display technology and, more particularly, relates to a display module, a display method, and a display device.

BACKGROUND

As display technologies develop, consumers have higher demanding on audio and video products. For display device manufacturers, producing display devices with high resolution and high image quality is a direction of development. Organic light-emitting diode (OLEDs) have been widely used in the display devices because of their characteristics including self-illumination, high brightness, a wide view angle, fast response, and RGB full-color components. OLED display panels have entered a practical stage, and are widely used in mobile products such as light and thin display devices including laptop computers, monitors, wall-mounted televisions. Development of full-color display will enhance competitiveness of OLED products.

Each organic light-emitting device in an organic light-emitting display panel corresponds to a sub-pixel. The organic light-emitting display panel will have a higher resolution when organic light-emitting devices in the organic light-emitting display panel have a higher arrangement density. However, limitation of accuracy of a mask, an alignment deviation, and accuracy of exposure in a vapor deposition process hinders further increasing of the resolution of the organic light-emitting devices.

There is a need to provide a display module, a display method, and a display device with improved display quality, to increase a resolution and reduce grainy monochromatic images.

SUMMARY

One aspect of the present disclosure provides a display module. The display module includes a display panel, including a plurality of sub-pixels; and a pixel shift unit, disposed at a side of a light-exiting surface of the display panel. Light emitted by the plurality of sub-pixels exits after passing through the pixel shift unit. For a sub-pixel of the plurality of sub-pixels: at a first time, the pixel shift unit does not shift the light emitted by the sub-pixel, and after the light emitted by the sub-pixel passing through the pixel shift unit, a first display pixel is formed corresponding to the sub-pixel at the first time, and at a second time, the pixel shift unit shifts the light emitted by the sub-pixel, and after the light emitted by the sub-pixel passing through the pixel shift unit, a second display pixel is formed corresponding to the sub-pixel at the second time. The second display pixel does not overlap the first display pixel. An orthographic projection of the second display pixel corresponding to the sub-pixel overlaps an orthographic projection of a first display pixel of at least one adjacent sub-pixel of the plurality of sub-pixels. For the first display pixel and second display pixel having overlapped orthographic projections, the orthographic projection of the first display pixel is located inside the orthographic projection of the second display pixel, or the orthographic projection of the second display pixel is located inside the orthographic projection of the first display pixel. For the first display pixel and second display pixel having overlapped orthographic projections, a sub-pixel of the plurality of sub-pixels, corresponding to the first display pixel, and another sub-pixel of the plurality of sub-pixels, corresponding to the second display pixel, have different colors.

Another aspect of the present disclosure provides a display method for a display module. The display module includes a display panel with sub-pixels and a pixel shift unit at a side of a light-emitting surface of the display panel. Light emitted by the sub-pixels exits after passing through the pixel shift unit. In one frame time including at least a first time and a second time, the method includes: at the first time, the sub-pixels receives first data signals, the pixel shift unit does not shift the light emitted by the sub-pixels, and the light emitted by the sub-pixels forms first display pixels after passing through the pixel shift unit; at a second time, the sub-pixels receives second data signals, the pixel shift unit shifts the light emitted by the sub-pixels receives first data signals and the light emitted by the sub-pixels forms second display pixels after passing through the pixel shift unit; and in the one frame time, the first display pixels and the second display pixels form a frame of image together.

Another aspect of the present disclosure provides a display device. The display device includes a display module. The display module includes a display panel, including a plurality of sub-pixels; and a pixel shift unit, disposed at a side of a light-exiting surface of the display panel. Light emitted by the plurality of sub-pixels exits after passing through the pixel shift unit. For a sub-pixel of the plurality of sub-pixels: at a first time, the pixel shift unit does not shift the light emitted by the sub-pixel, and after the light emitted by the sub-pixel passing through the pixel shift unit, a first display pixel is formed corresponding to the sub-pixel at the first time, and at a second time, the pixel shift unit shifts the light emitted by the sub-pixel, and after the light emitted by the sub-pixel passing through the pixel shift unit, a second display pixel is formed corresponding to the sub-pixel at the second time. The second display pixel does not overlap the first display pixel. An orthographic projection of the second display pixel corresponding to the sub-pixel overlaps an orthographic projection of a first display pixel of at least one adjacent sub-pixel of the plurality of sub-pixels. For the first display pixel and second display pixel having overlapped orthographic projections, the orthographic projection of the first display pixel is located inside the orthographic projection of the second display pixel, or the orthographic projection of the second display pixel is located inside the orthographic projection of the first display pixel. For the first display pixel and second display pixel having overlapped orthographic projections, a sub-pixel of the plurality of sub-pixels, corresponding to the first display pixel, and another sub-pixel of the plurality of sub-pixels, corresponding to the second display pixel, have different colors.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
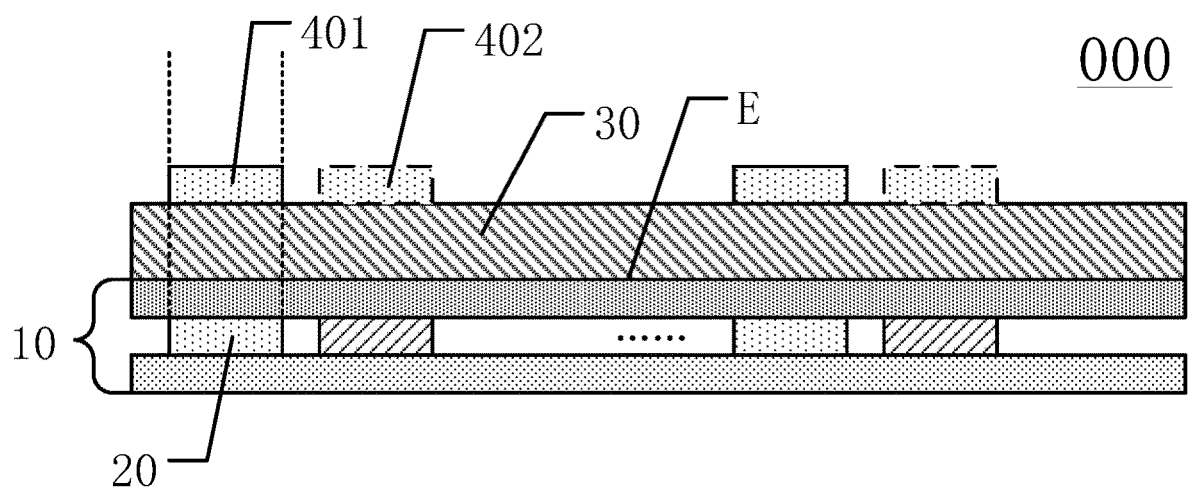
FIG. 1 illustrates a cross-section view of an exemplary display module consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

Figure 2:
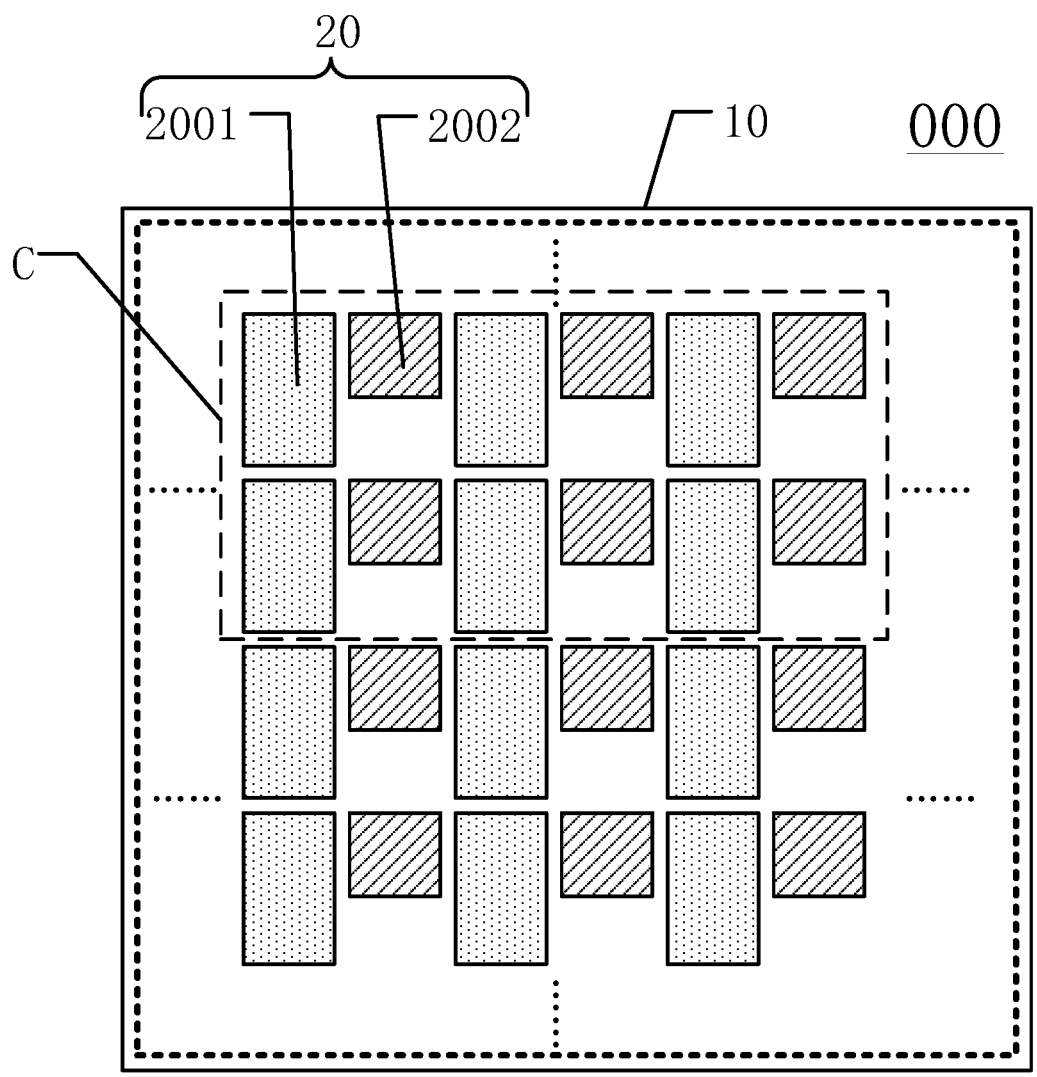
FIG. 2 illustrates a planar view of an exemplary display module consistent with various disclosed embodiments in the present disclosure.
Figure 3:
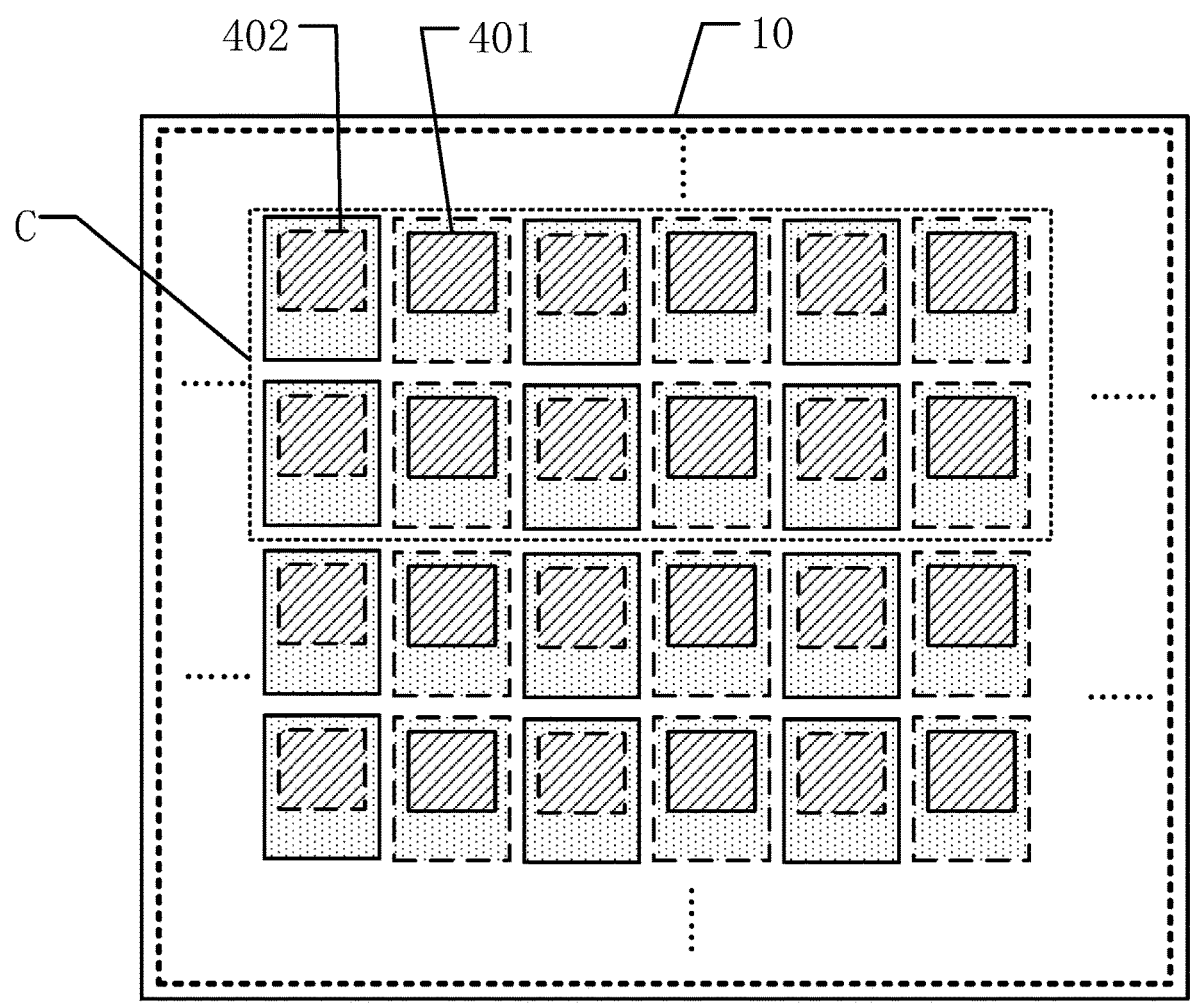
FIG. 3 illustrates an exemplary displayed image after a pixel shift unit for the display module in FIG. 1 and FIG. 2, consistent with various disclosed embodiments in the present disclosure.

FIG. 1 illustrates a cross-section view of an exemplary display module 000 consistent with various disclosed embodiments in the present disclosure; FIG. 2 illustrates a planar view of the display module 000 consistent with various disclosed embodiments in the present disclosure; and FIG. 3 illustrates an exemplary displayed image after pixel shift units for the display module 000 in FIG. 1 and FIG. 2, consistent with various disclosed embodiments in the present disclosure. As illustrated in FIGS. 1-3, in one embodiment, the present disclosure provides a display module 000. The display module 000 may include a display panel 10 and a pixel shift unit 30. The display pane 10 may include a plurality of sub-pixels 20. The pixel shift unit 30 may be disposed at a side of a light-emitting surface E of the display panel 10, and light from the plurality of sub-pixels 20 may be emitted after passing through the pixel shift unit 30. For one sub-pixel 20 of the plurality of sub-pixels 20, in a first time, the pixel shift unit 30 may not shift light from the sub-pixel 20, and the light from the sub-pixel 20 may form a first display pixel 401 (indicated by a solid line frame) after passing through the pixel shift unit 30; in a second time, the pixel shift unit 30 may shift the light from the sub-pixel 20, and the light from the sub-pixel 20 may form a second display pixel 402 (indicated by a broken line frame) after passing through the pixel shift unit. For the one sub-pixel 20 of the plurality of sub-pixels 20, the display pixels 401 may not overlap the second display pixel 402.

First display pixels 401 and second display pixels 402 with respect to the plurality of sub-pixels may be used as pixel points of a displayed image viewed by a user. Rectangular frames in FIGS. 1-3 are only used to illustrate positions of the first display pixels 401 and the second display pixels 402 with respect to the plurality of sub-pixels 20.

For one sub-pixel 20 of the plurality of sub-pixels 20, an orthographic projection of a second display pixel 40 with respect to the sub-pixel 20 on the display panel 10 may overlap an orthographic projection of a first display pixel 401 with respect to at least one sub-pixel 20 of the plurality of sub-pixels 20 adjacent to the sub-pixel 20 on the display panel 10.

For the second display pixel 402 with respect the one sub-pixel 20 of the plurality of sub-pixels 20 and the first display pixel 401 with respect to the at least one sub-pixel 20 of the plurality of sub-pixels 20 adjacent to the sub-pixel 20 whose orthographic projections overlap each other, the orthographic projection of the first display pixel 401 may be located inside the orthographic projection of the second display pixel 402, or the orthographic projection of the second display pixel 402 may be located inside the orthographic projection of the first display pixel 401.

For each second display pixel 402 and a corresponding first display pixel 401 whose orthographic projection overlaps the orthographic projection of the second display pixel 402, a sub-pixel 20 of the plurality of sub-pixels 20 with respect to the corresponding first display pixel 401 and a sub-pixel 20 of the plurality of sub-pixels 20 with respect to the second display pixel 402 may have different color. In the figures, sub-pixels of the plurality of sub-pixels 20 with different color are illustrated with different filling patterns. In the figures, the first display pixels 401 without shift are indicated with solid line frames, and the second display pixels 402 with shift are indicated with broken line frames. A size of the first display pixels 401 and the second display pixels 402 in the figures are for descriptive purposes only, and should not limit scopes of the present disclosure. In various embodiments, the size of the first display pixels 401 and the second display pixels 402 may be configured according to actual demanding.

Figure 4:
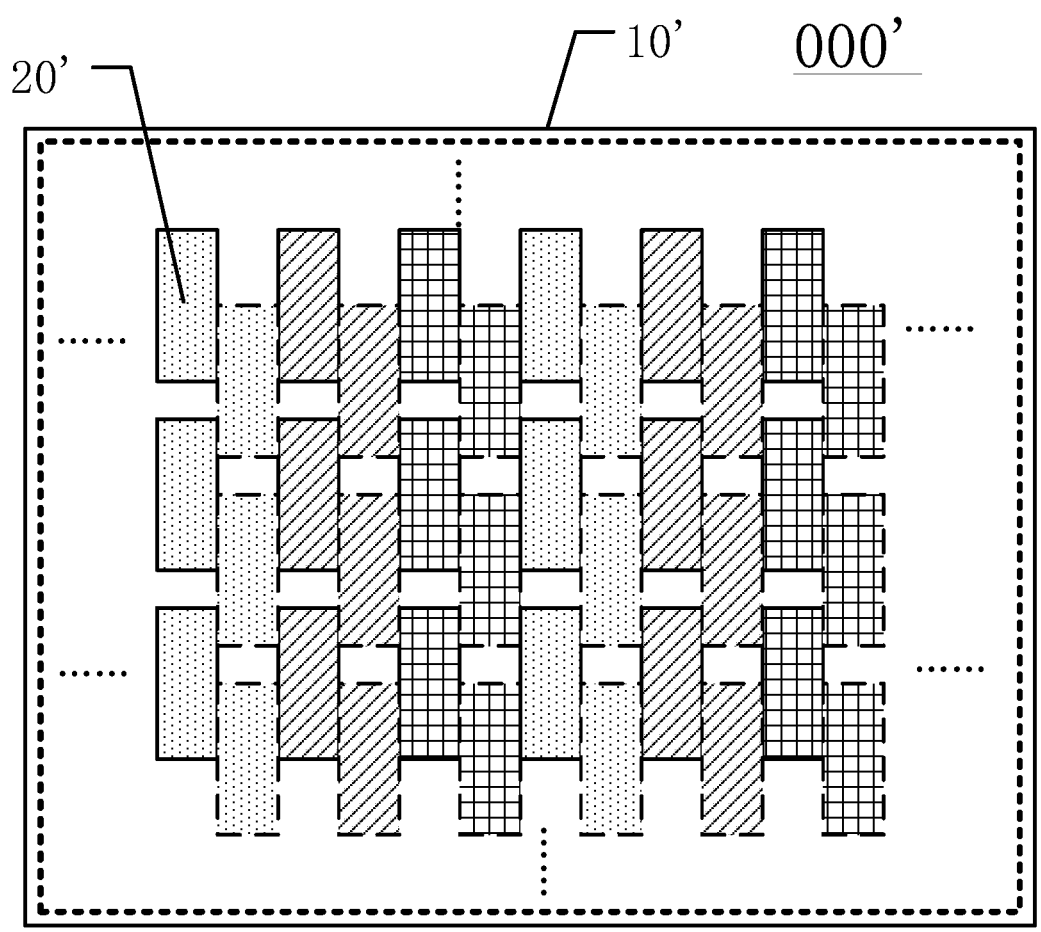
FIG. 4 illustrates a displayed image after a pixel shift unit for a conventional display module.

In a current display panel illustrated in FIG. 4 showing a display image after a pixel shift unit in a display module 000'. The display panel 10' of the display module 000' includes at least three sub-pixels 20' with different colors. The pixel shift unit changes polarization of the light from the display panel 10' at different time and then induces different shift of light paths at different time. Correspondingly, at different time, a same sub-pixel 20' of the display panel 10' is displayed at different position and does not interfere other sub-pixels 20'. A visual resolution of the display panel and a resolution of the display module 000' are improved. In FIG. 4, the sub-pixels with solid line frames indicate displayed images without shift induced by the pixel shift unit and the sub-pixels with broken line frames indicate displayed images with shift induced by the pixel shift unit. The sub-pixels with same filling patterns indicate the sub-pixels with same color. Although the displayed imaged are formed by the displayed images without shift induced by the pixel shift unit and the displayed images with shift induced by the pixel shift unit together, in a monochrome image, since a pixel point of a same sub-pixel 20' without shift induced by the pixel shift unit and a pixel point of the same sub-pixel 20' after shift induced by the pixel shift unit aggregate together, the image is more grainy. The display quality of the entire display module 000' is reduced.

In the present disclosure, the pixel shift unit 30 may be disposed in the display module 000. For one sub-pixel 20 of the plurality of sub-pixel 20, at the first time, the pixel shift unit 30 may not shift the light from the sub-pixel 20 of the plurality of sub-pixel 20, and the light from the sub-pixel 20 of the plurality of sub-pixel 20 may form a first display pixel 401 after passing through the pixel shift unit 30; at the second time, the pixel shift unit 30 may shift the light from the sub-pixel 20 of the plurality of sub-pixel 20, and the light from the sub-pixel 20 of the plurality of sub-pixel 20 may form a second display pixel 402. In the current display module 000' in FIG. 4, sub-pixels before being shifted by the pixel shift unit (sub-pixels without shift) of the display module 000' form an image, sub-pixels with different color before being shifted by the pixel shift unit form pixel units before being shifted, and sub-pixels with different color after being shifted by the pixel shift unit (sub-pixels with shift) form pixel units after being shifted. The pixel units after being shifted usually are located between adjacent sub-pixels (in no-pixel regions of the display panel) to avoid display problems induced by an ambiguous division of two adjacent pixel units in the displayed image and to avoid an influence between the pixel units after being shifted and the pixel units before being shifted. Correspondingly, the pixel units after being shifted and the pixel units before being shifted do not overlap in the space. Each pixel unit after being shifted and a corresponding pixel unit before being shifted have same color and are adjacent to each other. When displaying a monochrome image, for example, a red image, each red sub-pixel without shift and a corresponding red sub-pixel with shift may be connected to each other to form a bigger red sub-pixel. A more grainy image is formed visually in human eyes. To alleviate above problems, in the present disclosure, for a sub-pixel of the plurality of sub-pixels, a first display pixel 401 with respect to the sub-pixel 20 and a second display pixel 402 with respect to the sub-pixel 20 may not overlap. Correspondingly, the image formed by a sub-pixel 20 of the plurality of sub-pixels 20 after being shifted induced by the pixel shift unit 30 (the second display pixel 402) and the image formed by the sub-pixel 20 of the plurality of sub-pixels 20 before being shifted by the pixel shift unit 30 (the first display pixel 401) may not aggregate together. The image may be less grainy, and the display quality may be improved.

Figure 5:
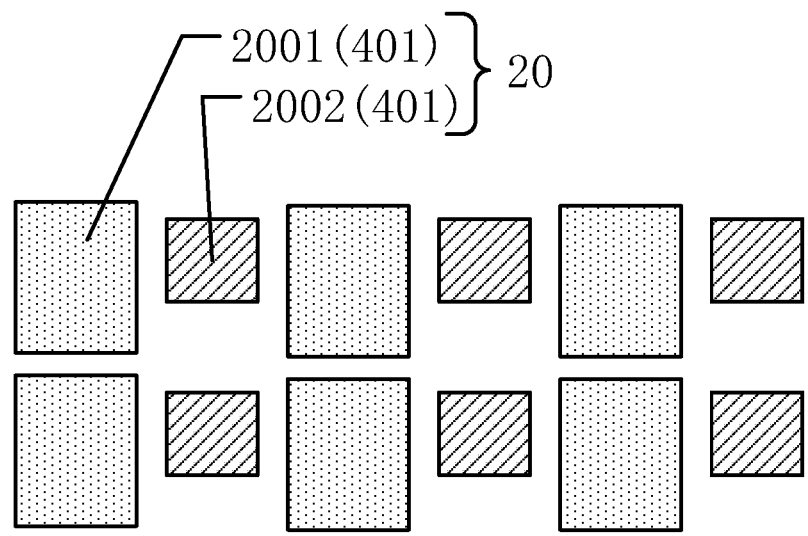
FIG. 5 illustrates a planar structure of first display pixels formed by light from sub-pixels in a C region without shift after passing through a pixel shift unit for the display module in FIG. 2.
Figure 6:
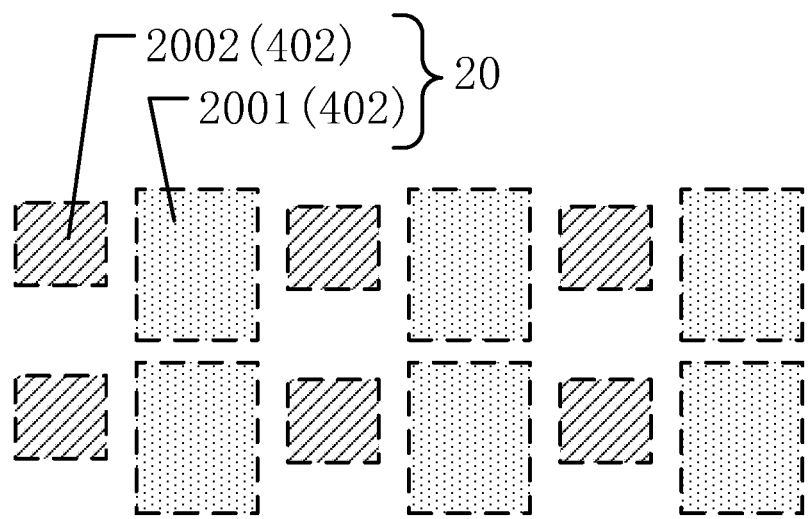
FIG. 6 illustrates a planar structure of second display pixels formed by light from sub-pixels in a C region with shift after passing a pixel shift unit for the display module in FIG. 2.

In one embodiment, as illustrated in FIGS. 2-3, two adjacent sub-pixels 20 of the plurality of sub-pixels 20 may include a sub-pixel 2001 and a sub-pixel 2002. For the sub-pixel 2001, an orthographic projection of a second display pixel 402 corresponding to the sub-pixel 2001 on the display panel 10 may overlap an orthographic projection of a first display pixel 401 corresponding to the sub-pixel 2002 on the display panel 10. (For a more detailed relationship between the first display pixels 401 and the second display pixels 402, please be referred to FIGS. 5-6. FIG. 5 illustrates a planar structure of first display pixels 401 formed by light from sub-pixels 20 in a C region without shift after passing pixel shift unit 30 for the display module in FIG. 2, and FIG. 6 illustrates a planar structure of the second display pixels 402 formed by light from sub-pixels 20 in a C region with shift after passing pixel shift unit 30 for the display module in FIG. 2 with a one-to-one correspondence to FIG. 5. The first display pixels 401 without shift are indicated by the solid line frames and the second display pixels 402 with shift are indicated by the broken line frames, in FIGS. 5-6. The size of the first display pixels 401 and the second display pixels 402 in the figures are for description purposes only, and should not limit scopes of the present disclosure. In various embodiments, the size of the first display pixels 401 and the second display pixels 402 may be configured according to actual demanding.) For the second display pixel 402 and the first display pixel 401 whose orthographic projections overlap each other, the orthographic projection of the first display pixel 401 may be located inside the orthographic projection of the second display pixel 402, or the orthographic projection of the second display pixel 402 may be located inside the orthographic projection of the first display pixel 401. For the second display pixel 402 and the first display pixel 401 whose orthographic projections overlap each other, the sub-pixel corresponding to the first display pixel 401 and the sub-pixel corresponding to the second display pixel 402 may have different color (indicated by different filling patterns in FIG. 2). In the current technologies, each pixel without shift forms a pixel unit and each pixel with shift forms a pixel unit. The pixel units with shift and the pixel units without shift do not overlap in the space to avoid influence on each other. In the present disclosure, the second display pixel 402 and the first display pixel 401 may overlap, i.e. be stacked in the space, by temporary cooperation. Since the sub-pixel corresponding to the first display pixel 401 and the sub-pixel corresponding to the second display pixel 402 may have different color, the color may be mixed better. The pixel units with shift may not be located between adjacent sub-pixels of the plurality of sub-pixels 20 (non-pixel regions in the display panel), but be located at positions of the sub-pixels of the display panel. A division between adjacent display pixels that do not overlap may be clear. A grainy image may be avoided and the resolution of the display module 100 may be improved simultaneously. In the present disclosure, the pixel shift unit 30 may change polarization of light emitted by the display panel 10 at different time, and induce different shift of the light paths. Correspondingly, a same sub-pixel 20 of the plurality of sub-pixels 20 in the display panel may be displayed at different positions at different time without interference. Since a distance between the first time and the second time may be small, the displayed images at the two different time may be considered as a continuous video or an animation effect. A visual resolution and the resolution of the display module 000 may be improved.

For description purposes only, the embodiments illustrated in FIGS. 1-3 and FIGS. 5-6 with sub-pixels at two different colors are used as examples to illustrate the present disclosure, and should not limit scopes of the present disclosure. In various embodiments, the color of the sub-pixels may have three or more. Also, the film layer structure of the display panel 10 illustrated in FIG. 1 is as an example to illustrate the present disclosure, and should not limit scopes of the present disclosure. In various embodiments, the display panel may have any suitable film layer structure according to actual demanding. The present disclosure has no limit on a structure of the pixel shift unit 30, and the pixel shift unit 30 may have any suitable structure as long as the pixel shift unit 30 satisfies that the pixel shift unit 30 may not shift the light from a sub-pixel 20 of the plurality of sub-pixels 20 to form a first display pixel 401 at the first time and may shift the light from a sub-pixel 20 of the plurality of sub-pixels 20 to form a second display pixel 402 at the second time where the first display pixel 401 may not overlap the second display pixel 402.

Figure 7:
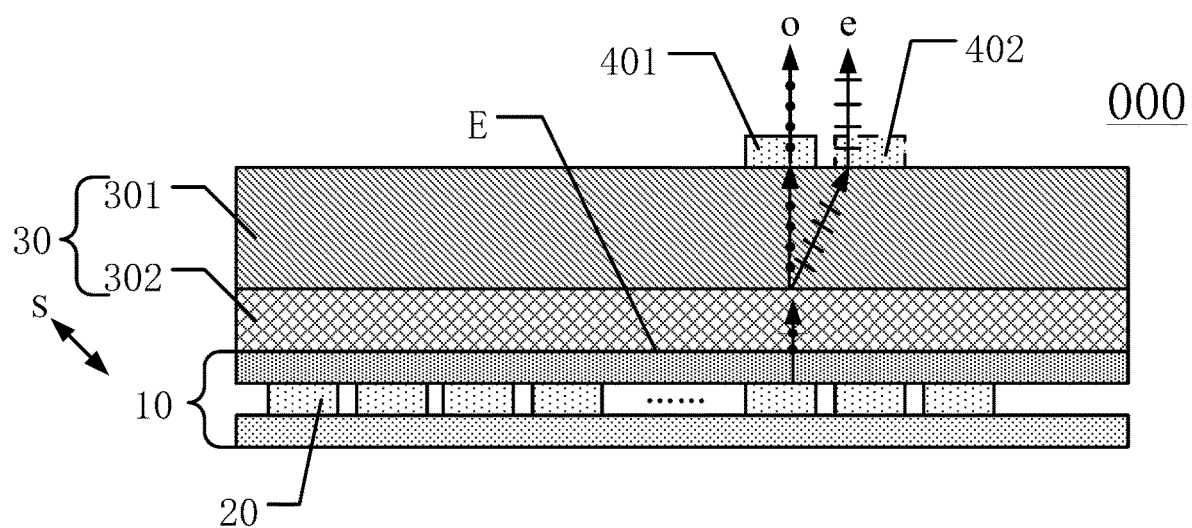
FIG. 7 illustrates a cross-section view of another exemplary display module consistent with various disclosed embodiments in the present disclosure.

FIG. 7 illustrates a cross-section view of another display module 000 provided by the present disclosure. In one embodiment illustrated in FIG. 7, the pixel shift unit 30 of the display module 000 may at least include a birefringent layer 301 and a light valve 302. The light valve 302 may be disposed between the display panel 10 and the birefringent layer 301.

In one embodiment, the plurality of sub-pixels 20 in the display panel 10 may emit natural light. The birefringent layer 301 may be disposed at a side of a light-emitting surface of the display panel 10, and the light valve 302 may be disposed between the display panel 10 and the birefringent layer 301, to control a polarization direction of light incident on the birefringent layer 301. The polarization direction of the light incident on the birefringent layer 301 may be controlled to be a first polarization direction at the first time, and the polarization direction of the light incident on the birefringent layer 301 may be controlled to be a second polarization direction at the second time. The first polarization direction and the second polarization direction may be both parallel to the light-emitting surface of the display panel 10, and may be perpendicular to each other. In FIG. 7, the light is indicated by lines with arrows and directions pointed by the arrows are propagating directions of the light. The lines with circles indicate the light with the first polarization direction, and the lines with short dashes indicate the light with the second polarization direction. The lines with circles and short dashes indicate the natural light. An optical axis of the birefringent layer 301 may be perpendicular to the first polarization direction and may have an angle of about 0 degrees to about 90 degrees with the second polarization direction. Correspondingly, the light valve 302 may control the polarization direction of the light incident to the birefringent layer 301 to be the first polarization direction at the first time, and the light from the sub-pixels 20 may be not shifted after passing through the pixel shift unit 30 to form the first display pixels 401. The light incident to the birefringent layer 301 may directly exit through the birefringent layer 301 and the light transmitting through the birefringent layer 301 may be first light with the first polarization direction, that is the natural light o corresponding to the birefringent layer 301. At the second time, the light valve 302 may control the polarization direction of the light incident to the birefringent layer 301 to be the second polarization direction at the first time, and the light from the sub-pixels 20 may be shifted after passing through the pixel shift unit 30 to form the second display pixels 402. The light incident to the birefringent layer 301 may exit through the birefringent layer 301 after being refracted and the light transmitting through the birefringent layer 301 may be second light with the second polarization direction, that is the abnormal light e corresponding to the birefringent. layer 301.

For description purposes only, the embodiment where the light valve 302 is disposed between the display panel 10 and the birefringent layer 301 is used as an example to illustrate a working principle of the birefringent layer 301 to shift or not shift the light from the plurality of sub-pixels 20 in the present disclosure, and should not limit the scopes of the present disclosure. In various embodiment, the light valve 302 may be disposed at any suitable position as long as the birefringent layer 301 to shift can or can not shift the light from the plurality of sub-pixels 20. For example, the light valve 302 may be disposed at a side of the birefringent layer 301 away from the display panel 10.

In one embodiment illustrated in FIGS. 1-3, an interval between the first time and the second time may be smaller than or equal to about 100 ms.

In one embodiment, for one sub-pixel 20 of the plurality of sub-pixels 20, an interval between the first time when the light from the sub-pixel 20 may not be shifted by the pixel shift unit 30 to form the first display pixel 401 and the second time when the light from the sub-pixel 20 may be shifted by the pixel shift unit 30 to form the second display pixel 402 may be smaller than or equal to about 100 ms. An important characteristic of eyes is visual inertia. That is, once an optical image is formed on a retina, vision will maintain a sense of the optical image for a limited period of time. This physiological phenomenon is called visual persistence. For a light stimulation with medium intensity, visual persistence is about 100 ms. In one embodiment, the interval between the first time and the second time may be smaller than or equal to about 100 ms. Correspondingly, when the first display pixels 401 and the second display pixels 402 formed at different time are viewed by human eyes, they may be considered as a video or an animation effect. The visual resolution of the display module 000 and the resolution of the display panel may be improved.

Figure 8:
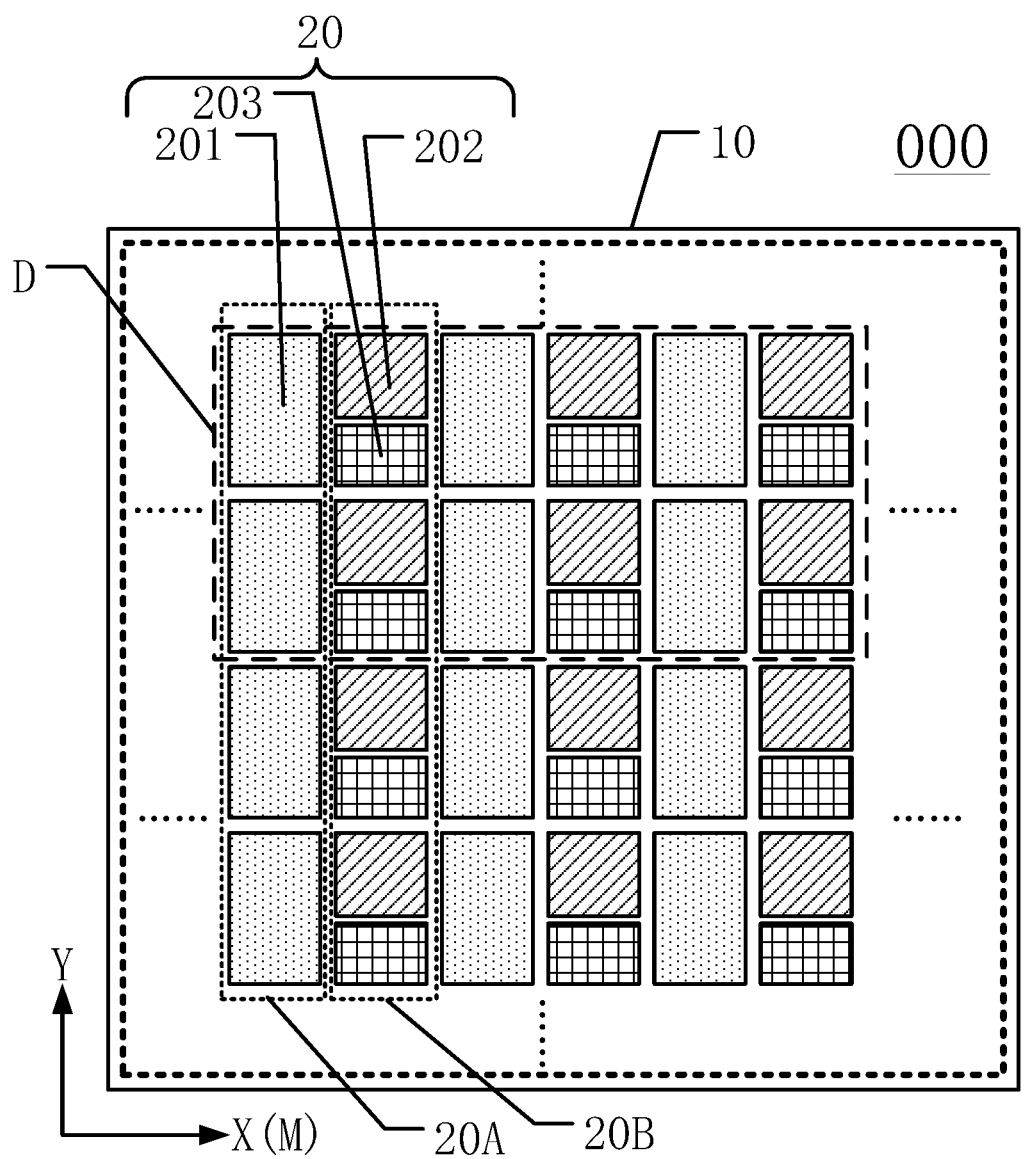
FIG. 8 illustrates a cross-section view of another exemplary display module consistent with various disclosed embodiments in the present disclosure.
Figure 9:
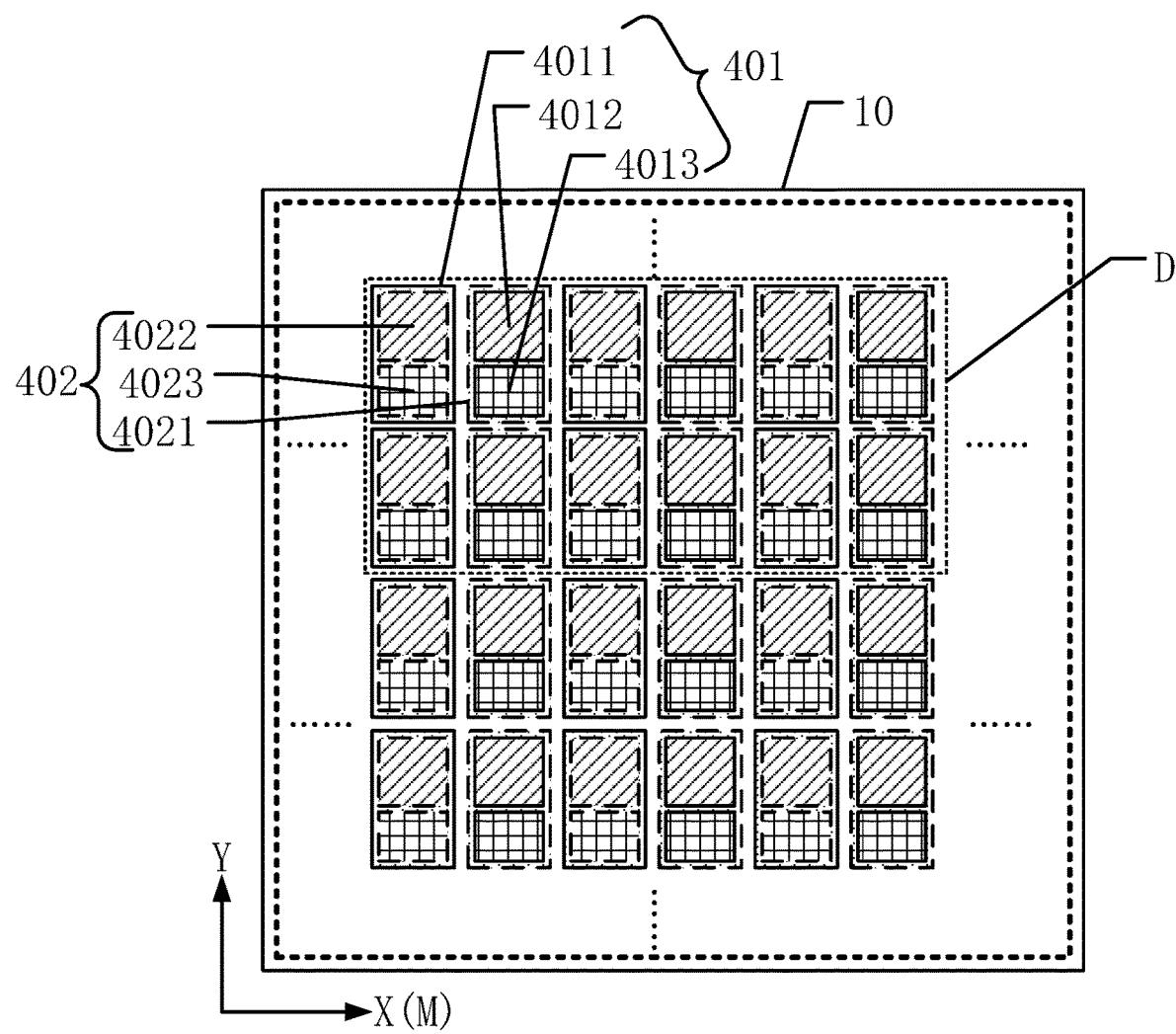
FIG. 9 illustrates an exemplary displayed image after pixel shift unit for the display module in FIG. 8, consistent with various disclosed embodiments in the present disclosure.
Figure 10:
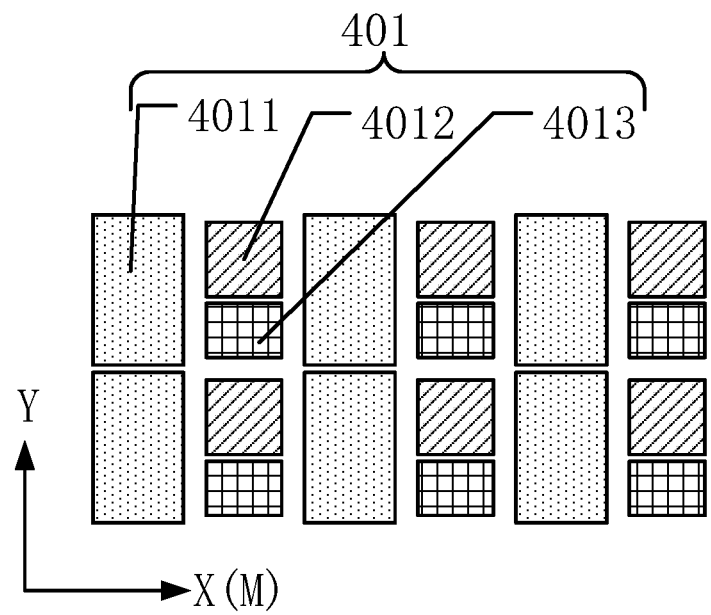
FIG. 10 illustrates a planar structure of first display pixels formed by light from sub-pixels in a D region without shift after passing a pixel shift unit for the display module in FIG. 8.
Figure 11:
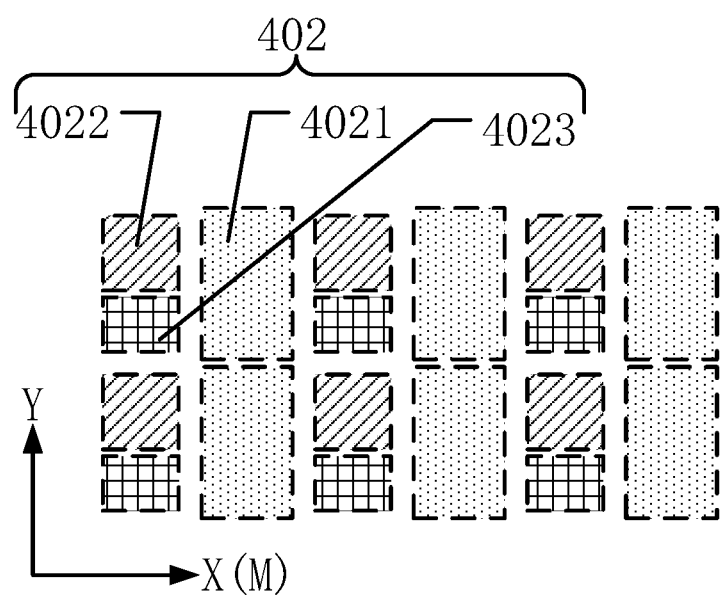
FIG. 11 illustrates a planar structure of second display pixels formed by light from sub-pixels in the D region with shift after passing a pixel shift unit for the display module in FIG. 8.

FIG. 8 illustrates a cross-section view of another exemplary display module consistent with various disclosed embodiments in the present disclosure; FIG. 9 illustrates an exemplary displayed image after pixel shift unit for the display module in FIG. 8, consistent with various disclosed embodiments in the present disclosure; FIG. 10 illustrates a planar structure of first display pixels formed by light from sub-pixels in a D region without shift after passing a pixel shift unit for the display module in FIG. 8; FIG. 11 illustrates a planar structure of second display pixels formed by light from sub-pixels in the D region with shift after passing a pixel shift unit for the display module in FIG. 8. (In the figures, sub-pixels of the plurality of sub-pixels 20 with different color are illustrated with different filling patterns. In FIG. 3, the first display pixels 401 without shift are indicated with solid line frames, and the second display pixels 402 with shift are indicated with broken line frames. A size of the first display pixels 401 and the second display pixels 402 in the figures are for description purposes only, and should not limit scopes of the present disclosure. In various embodiments, the size of the first display pixels 401 and the second display pixels 402 may be configured according to actual demanding.) In one embodiment illustrated in FIGS. 8-11, the plurality of sub-pixels 20 in the display module 000 may include first sub-pixels 201, second sub-pixels 202, and third sub-pixels 203. The first sub-pixels 201, the second sub-pixels 202, and the third pixels 203 may have different color.

The first sub-pixels 201 may be arranged along a first direction Y to form first pixel groups 20A. The second sub-pixels 202 and the third sub-pixels 203 may be arranged alternately along a first direction Y to form second pixel groups 20B. The first pixel groups 20A and the second pixel groups 20B may be arranged alternately along a second direction X. The second direction X may cross the first direction Y.

A shift direction M of the light from the plurality of sub-pixels 20 by the pixel shift unit 30 may be same as the second direction X.

For each first pixel group 20A and an adjacent second pixel group 20B arranged alternately along a second direction X, a second display pixel 4021 corresponding to a first sub-pixel 201 may have an orthographic projection on the display panel 10 overlapping an orthographic projection of a first display pixel 4012 with respect to a corresponding second sub-pixel 202 on the display panel 10 and overlapping an orthographic projection of a first display pixel 4013 with respect to a third sub-pixel 203 adjacent to the second sub-pixel 202 on the display panel 10.

For each first pixel group 20A and an adjacent second pixel group 20B arranged alternately along a second direction X, an orthographic projection of a second display pixel 4022 with respect to a second sub-pixel 202 on the display panel 10 and an orthographic projection of a second display pixel 4023 with respect to a third sub-pixel 203 adjacent to the second sub-pixel 202 on the display panel 10 may be both located inside an orthographic projection of a first display pixel 4011 corresponding to a corresponding first sub-pixel 201 on the display panel 10.

A second display pixel 4021 of a first sub-pixel 201, a first display pixel 4012 of a corresponding second sub-pixel 202, and a first display pixel 4013 of a corresponding third sub-pixel 203 whose orthographic projections overlap each other, may form a display pixel unit. A first display pixel 4011 of a first sub-pixel 201, a second display pixel 4022 of a corresponding second sub-pixel 202, and a second display pixel 4023 of a corresponding third sub-pixel 203 whose orthographic projections overlap each other, may form a display pixel unit.

In the display module 000 of this embodiment, the first sub-pixels 201 may be arranged along the first direction Y to form the first pixel groups 20A, and the second sub-pixels 202 and the third sub-pixels 203 may be arranged alternately along the first direction Y to form the second pixel groups 20B. The first pixel groups 20A and the second pixel groups 20B may be arranged alternately along the second direction X. Correspondingly, the display module 000 with the pixels arranged in this configuration may have improved resolution and a less grainy monochromatic image. Also, for each first pixel group 20A and an adjacent second pixel group 20B arranged alternately along a second direction X, a second display pixel 4021 corresponding to a first sub-pixel 201 may have an orthographic projection on the display panel 10 overlapping an orthographic projection of a first display pixel 4012 with respect to a corresponding second sub-pixel 202 on the display panel 10 and overlapping an orthographic projection of a first display pixel 4013 with respect to a third sub-pixel 203 adjacent to the second sub-pixel 202 on the display panel 10. For each first pixel group 20A and an adjacent second pixel group 20B arranged alternately along a second direction X, an orthographic projection of a second display pixel 4022 with respect to a second sub-pixel 202 on the display panel 10 and an orthographic projection of a second display pixel 4023 with respect to a third sub-pixel 203 adjacent to the second sub-pixel 202 on the display panel 10 may be both located inside an orthographic projection of a first display pixel 4011 corresponding to a corresponding first sub-pixel 201 on the display panel 10. Correspondingly, the sub-pixels with different color may have different size. A second display pixel 4021 of a first sub-pixel 201, a first display pixel 4012 of a corresponding second sub-pixel 202, and a first display pixel 4013 may overlap each other. A first display pixel 4011 of a first sub-pixel 201, a second display pixel 4022 of a corresponding second sub-pixel 202, and a second display pixel 4023 of a corresponding third sub-pixel 203 may overlap each other. Correspondingly, a white pixel may be formed in the displayed image. In a monochromatic image, the sub-pixels with different color may be distributed more homogenously to reduce a grainy image. The display quality of the display module 000 may be improved.

In one embodiment illustrated in FIGS. 8-11, the first sub-pixels 201 may be blue sub-pixels, the second sub-pixels 202 may be red sub-pixels, and the third sub-pixels 203 may be green sub-pixels. In some other embodiments, the first sub-pixels 201 may be blue sub-pixels, the second sub-pixels 202 may be green sub-pixels, and the third sub-pixels 203 may be red sub-pixels.

In the display module 000 of the present embodiment, the sub-pixels with different color may have different size. A second display pixel 4021 of a first sub-pixel 201, a first display pixel 4012 of a corresponding second sub-pixel 202, and a first display pixel 4013 may overlap each other. A first display pixel 4011 of a first sub-pixel 201, a second display pixel 4022 of a corresponding second sub-pixel 202, and a second display pixel 4023 of a corresponding third sub-pixel 203 may overlap each other. When the first sub-pixels are the blue sub-pixels, since the blue sub-pixels may have a shortest lifetime among the sub-pixels with R (red), G (green), and B (blue) primary colors, an area of the blue sub-pixels may be configured to be the largest. The area of the blue sub-pixels may be increased and a current density of the blue sub-pixels may be reduced. (A current density is a physical quantity describing a current intensity and a flow direction of current at a certain point in a circuit. The current density is a vector whose magnitude is equal to an amount of electricity passing through a unit area per unit time. A direction vector of the current density is a normal vector of a corresponding cross-section of the unit area, pointing to positive charges. The current density has a unit of ampere per square meter denoted as $A/m^2$, and is generally represented as J in physics. The current density may be given as $J=I/S$ where I is the current magnitude and S is the area.) The lifetime of the blue sub-pixels may be improved.

Figure 12:
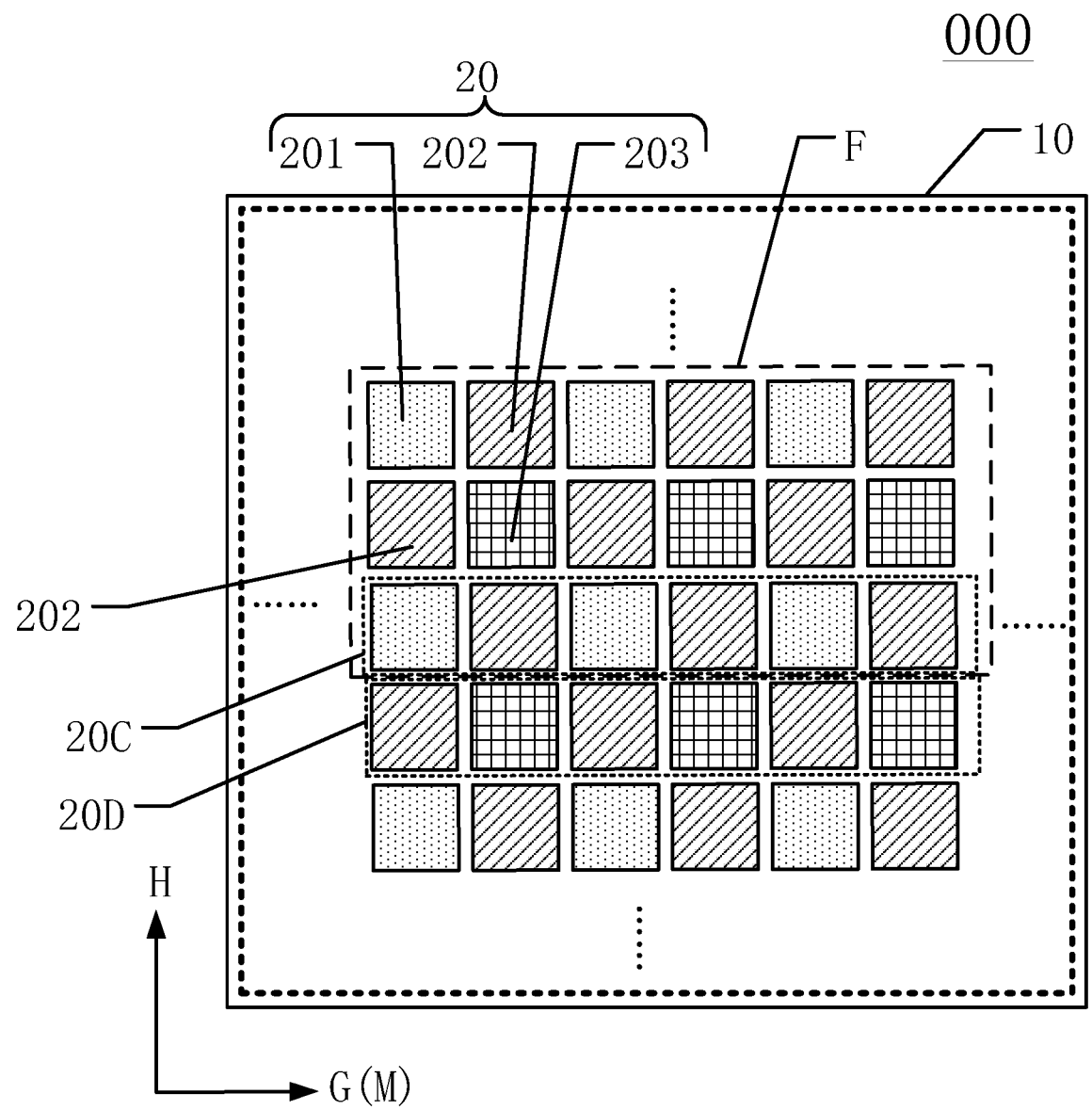
FIG. 12 illustrates a cross-section view of another exemplary display module consistent with various disclosed embodiments in the present disclosure.
Figure 13:
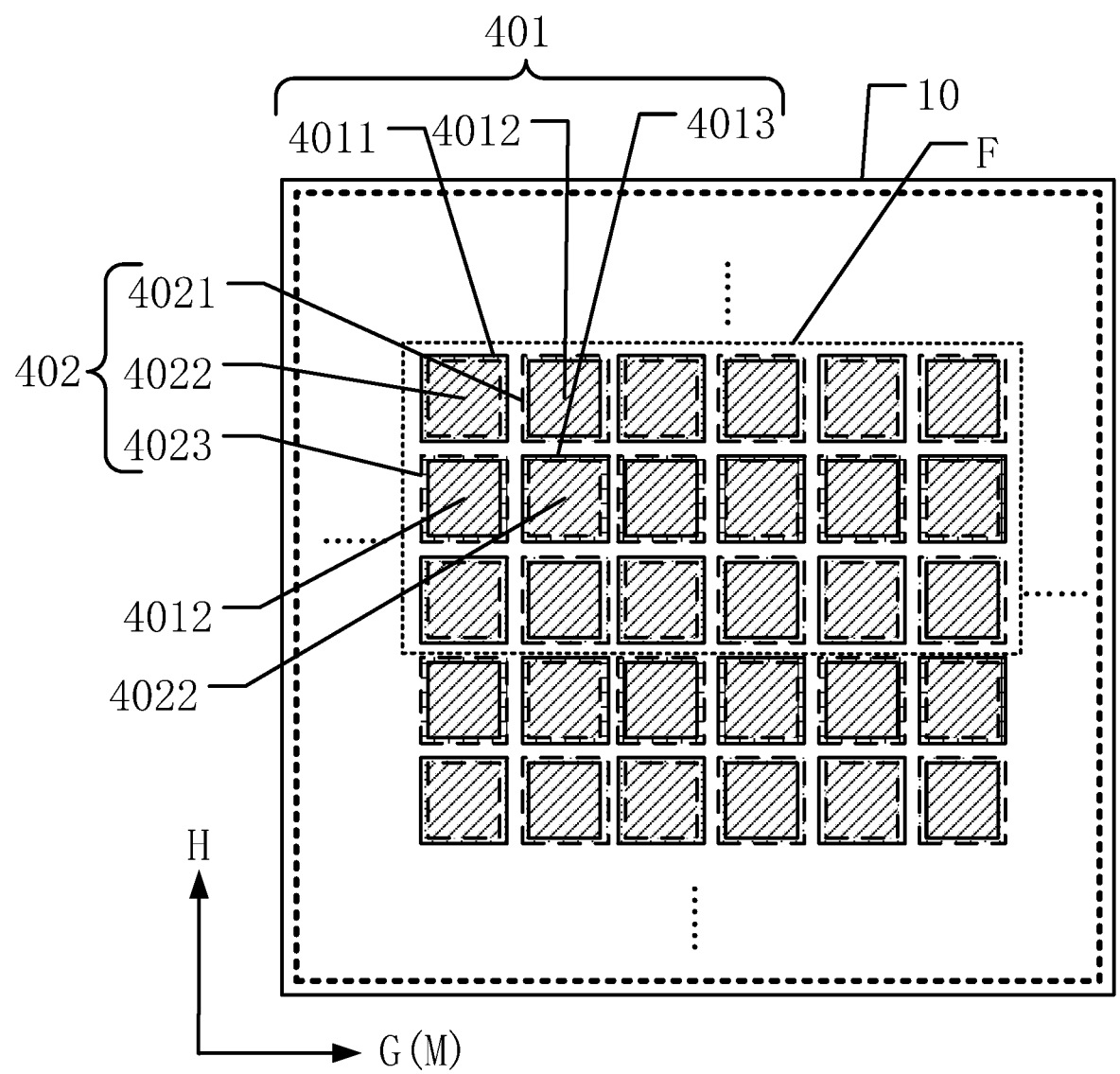
FIG. 13 illustrates an exemplary displayed image after a pixel shift unit for the display module in FIG. 12, consistent with various disclosed embodiments in the present disclosure.
Figure 14:
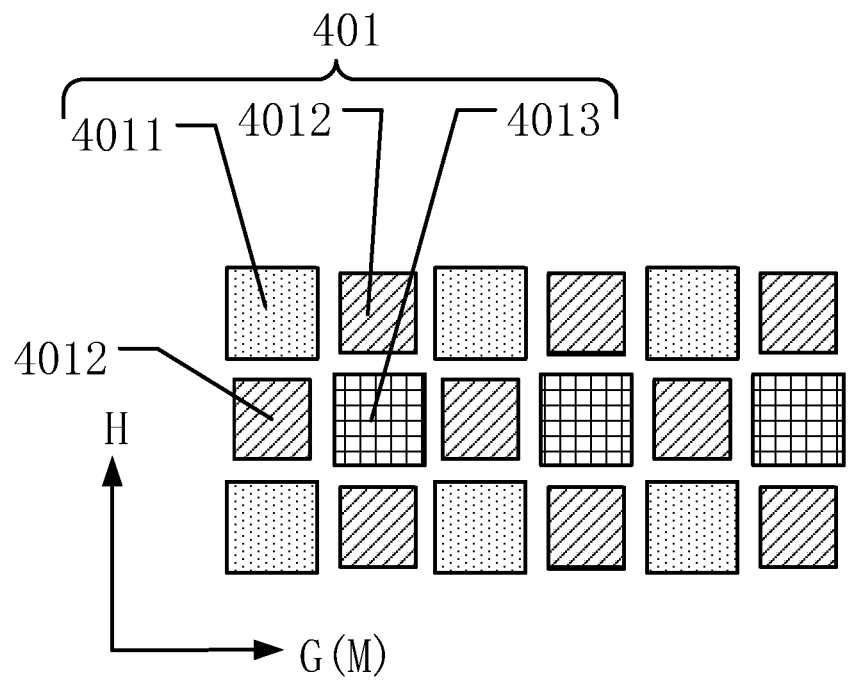
FIG. 14 illustrates a planar structure of first display pixels formed by light from sub-pixels in an F region without shift after passing a pixel shift unit for the display module in FIG. 12.
Figure 15:
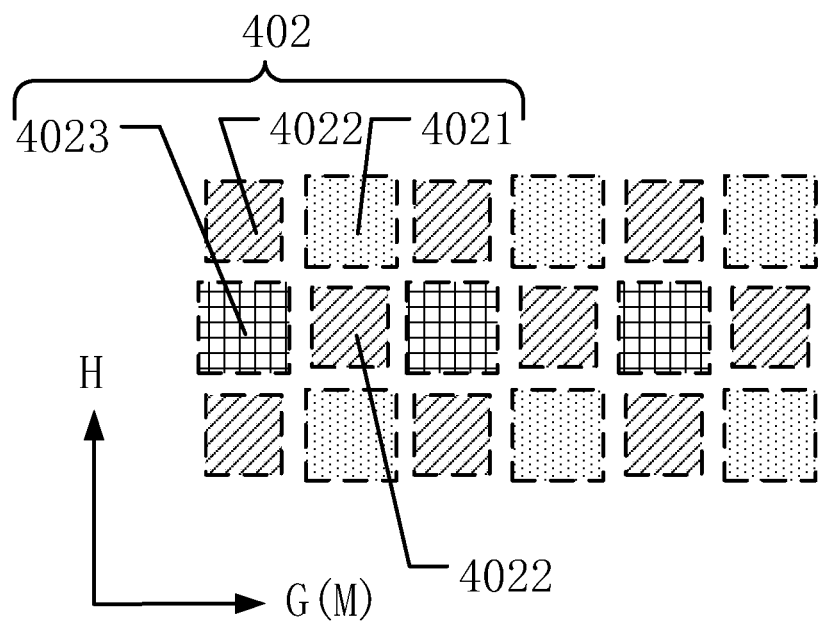
FIG. 15 illustrates a planar structure of second display pixels formed by light from sub-pixels in the F region with shift after passing a pixel shift unit for the display module in FIG. 12.

FIG. 12 illustrates a cross-section view of another exemplary display module consistent with various disclosed embodiments in the present disclosure; FIG. 13 illustrates an exemplary displayed image after pixel shift unit for the display module in FIG. 12, consistent with various disclosed embodiments in the present disclosure; FIG. 14 illustrates a planar structure of first display pixels formed by light from sub-pixels in an F region without shift after passing a pixel shift unit for the display module in FIG. 12; FIG. 15 illustrates a planar structure of second display pixels formed by light from sub-pixels in the F region with shift after passing a pixel shift unit for the display module in FIG. 12. (In the figures, sub-pixels of the plurality of sub-pixels 20 with different color are illustrated with different filling patterns. In FIG. 3, the first display pixels 401 without shift are indicated with solid line frames, and the second display pixels 402 with shift are indicated with broken line frames. Size of the first display pixels 401 and the second display pixels 402 in the figures are for description purposes only, and should not limit scopes of the present disclosure. In various embodiments, the size of the first display pixels 401 and the second display pixels 402 may be configured according to actual demanding.) In one embodiment illustrated in FIGS. 12-15, the plurality of sub-pixels 20 in the display module 000 may include first sub-pixels 201, second sub-pixels 202, and third sub-pixels 203. The first sub-pixels 201, the second sub-pixels 202, and the third pixels 203 may have different color.

The first sub-pixels 201 and the second sub-pixels 202 may be arranged along a third direction G to form third pixel groups 20C. The second sub-pixels 202 and the third sub-pixels 203 may be arranged alternately along the third direction G to form fourth pixel groups 20D. The third pixel groups 20C and the fourth pixel groups 20D may be arranged alternately along a fourth direction G. The fourth direction G may cross the third direction G. In some embodiments, along the fourth direction G, two adjacent sub-pixels 20 may have different colors.

A shift direction M of the light from the plurality of sub-pixels 20 by the pixel shift unit 30 may be same as the third direction G.

For each third pixel group 20C, along the shift direction M, a second display pixel 4021 corresponding to a first sub-pixel 201 may have an orthographic projection on the display panel 10 overlapping an orthographic projection of a first display pixel 4012 corresponding to an adjacent second sub-pixel 202 on the display panel 10, and an orthographic projection of a second display pixel 4022 corresponding to a second sub-pixel 202 may overlap an orthographic projection of a first display pixel 4011 with respect to an adjacent first sub-pixel 201 on the display panel 10.

For each fourth pixel group 20D, along the shift direction M, an orthographic projection of a second display pixel 4022 with respect to a second sub-pixel 202 on the display panel 10 may overlap an orthographic projection of a first display pixel 4013 with respect to a third sub-pixel 203 adjacent to the second sub-pixel 202 on the display panel 10, and an orthographic projection of a second display pixel 4023 with respect to a third sub-pixel 203 may overlap an orthographic projection of a first display pixel 4012 with respect to an adjacent second sub-pixel 202 on the display panel 10.

In the display module of the present embodiment, the first sub-pixels 201 and the second sub-pixels 202 may be arranged along the third direction G to form the third pixel groups 20C. The second sub-pixels 202 and the third sub-pixels 203 may be arranged alternately along the third direction G to form the fourth pixel groups 20D. The third pixel groups 20C and the fourth pixel groups 20D may be arranged alternately along the fourth direction G.

Correspondingly, the display module 000 with the pixels arranged in this configuration may have improved resolution and a less grainy monochromatic image.

In some embodiments illustrated in FIGS. 12-15, the first sub-pixels 201 may be blue sub-pixels, the second sub-pixels 202 may be green sub-pixels, and the third sub-pixels 203 may be red sub-pixels.

In the present disclosure, the first sub-pixels 201 may be blue sub-pixels, the second sub-pixels 202 may be green sub-pixels, and the third sub-pixels 203 may be red sub-pixels. Correspondingly, an arrangement of the plurality of sub-pixels in the display module may be different from a standard RGB arrangement. A display unit of the standard RGB arrangement is composed of three sub-pixels with red, green, and blue. In the present embodiment, the arrangement of the plurality of sub-pixels may form two different types of display units. A first type display unit may include a red sub-pixel and a green sub-pixel, and a second type display unit may include a blue sub-pixel and a green sub-pixel. Since only three primary colors can form all colors and two colors cannot form all colors, a display unit in the present disclosure may borrow another color from an adjacent display unit to form three primary colors when the display module displays images. Each display unit and an adjacent display unit may share a sub-pixel with a color that they do not have, to achieve a white display together. The standard RGB arrangement is used in liquid crystal display devices. A liquid crystal display device usually uses a backlight source to emit light passively, and its RGB implementation on the display device is a filter. The filter can be formed easily and high-density RGB ribbons do not increase cost significantly. For an organic light-emitting display panel that emits light actively, RGB corresponds to organic light-emitting materials. Each of the light-emitting materials may be needed to be small, and may be integrated with a high density, to achieve a display device with high resolution. The fabrication process may be difficult, and the cost may be high. In the present disclosure, the pixel arrangement may be achieved by sharing a common sub-pixel by adjacent display units. A number of the plurality of sub-pixels in the display panel with a same area may be reduced. A low resolution may be used to simulate a high-resolution display effect, and the display module may have a high visual brightness at the same brightness. In the sub-pixel arrangement of the present disclosure, each display unit may only include two materials and each of the two materials may have a larger area. The fabrication process may be simplified and the cost may be reduced. Since human eyes are most sensitive to green in the three primary colors (red, green, and blue), in the present disclosure, the first sub-pixels 201 may be blue sub-pixels, the second sub-pixels 202 may be green sub-pixels, and the third sub-pixels 203 may be red sub-pixels. A number of the green sub-pixels may be larger than a number of the blue sub-pixels and a number of the red sub-pixels. The visual resolution of the human eyes and the display quality may be improved further.

Figure 16:
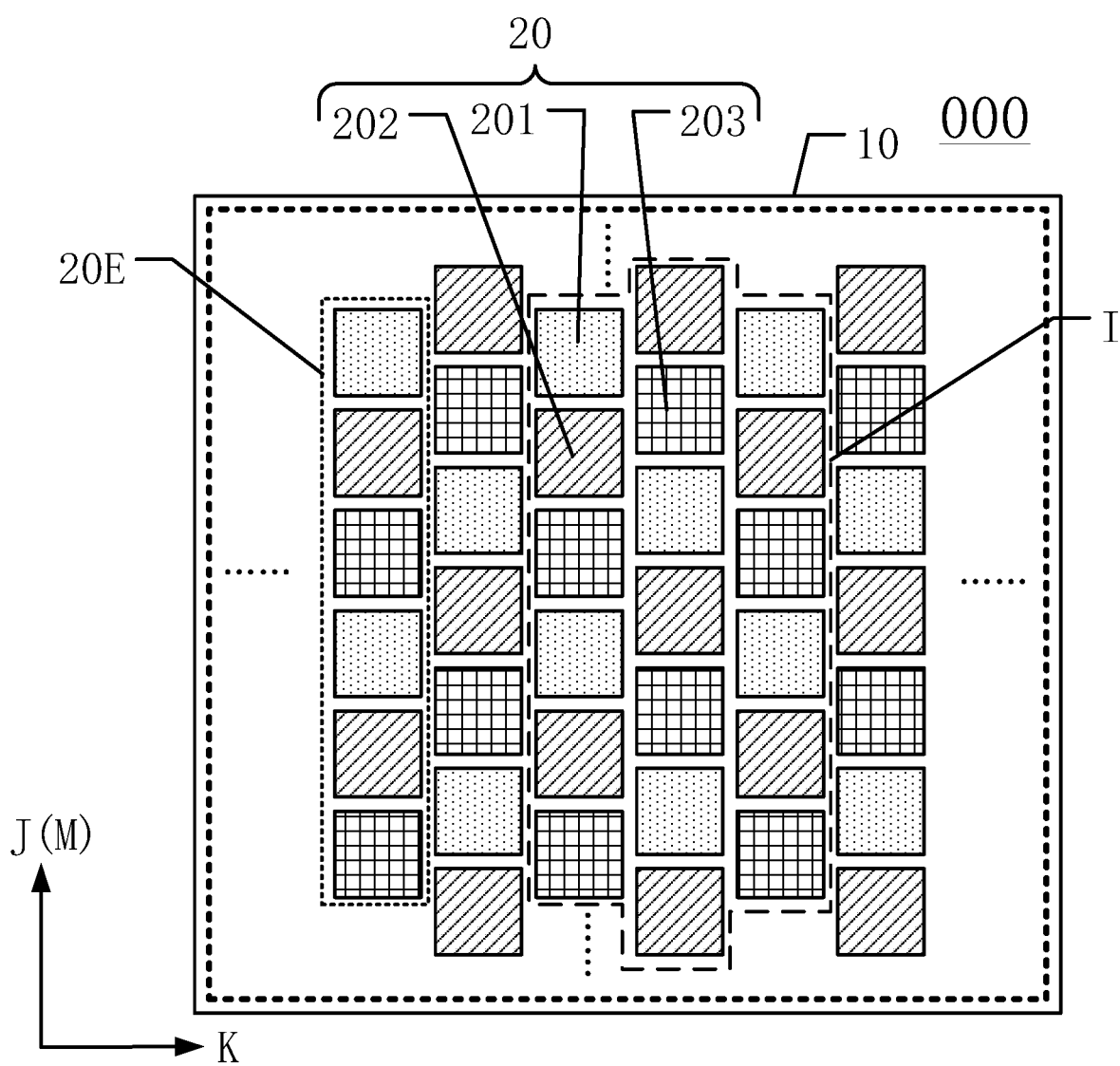
FIG. 16 illustrates a cross-section view of another exemplary display module consistent with various disclosed embodiments in the present disclosure.
Figure 17:
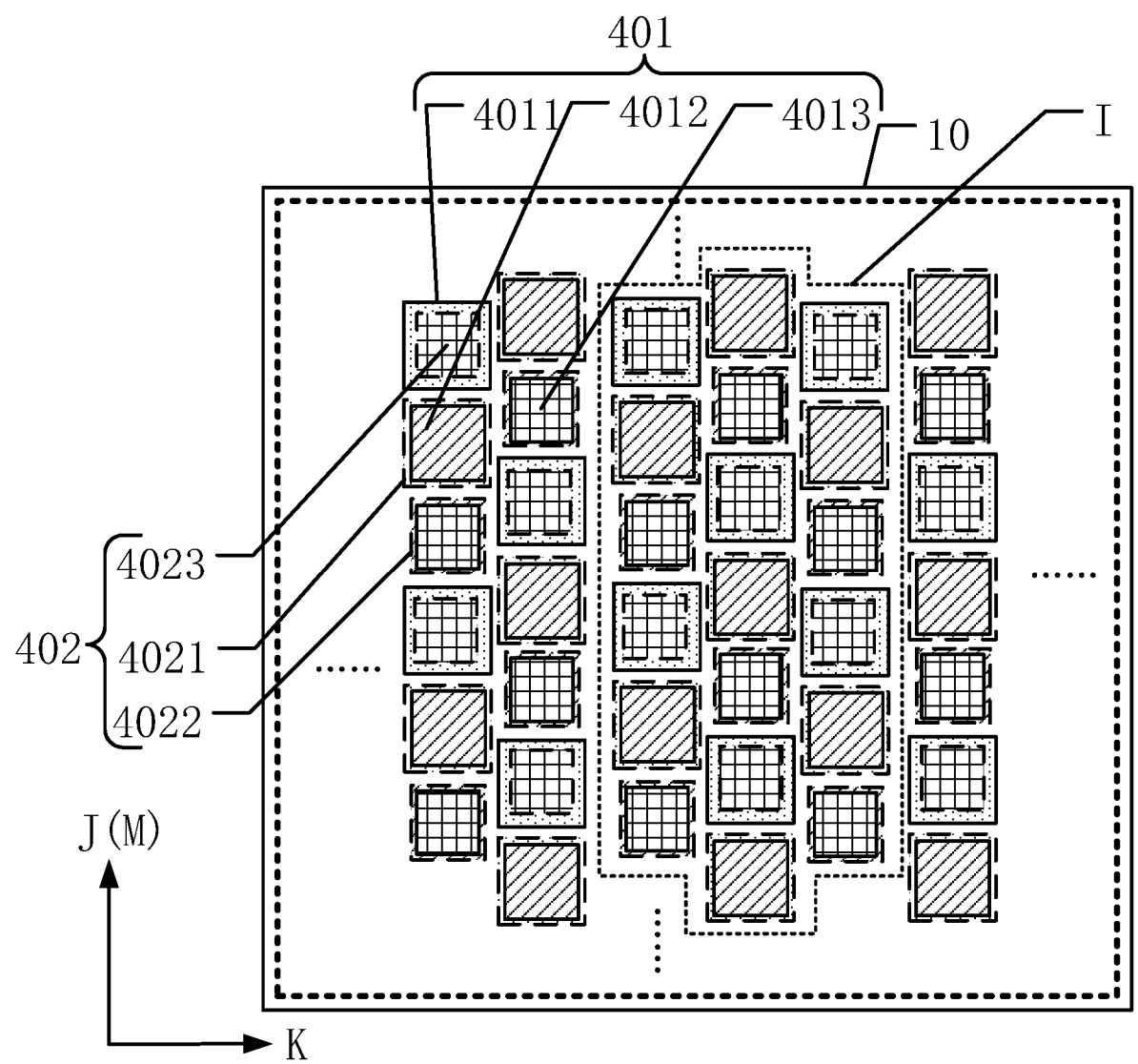
FIG. 17 illustrates an exemplary displayed image after a pixel shift unit for the display module in FIG. 16, consistent with various disclosed embodiments in the present disclosure.
Figure 18:
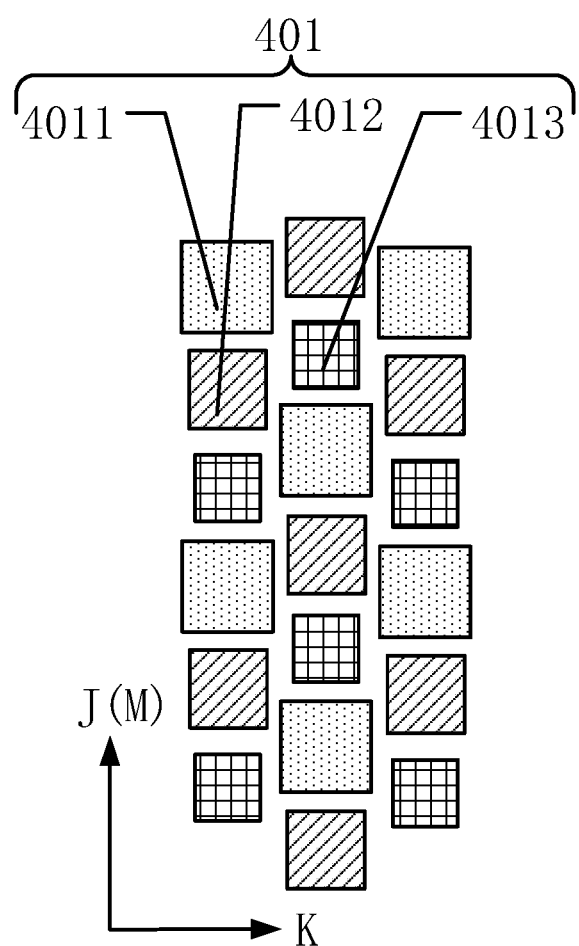
FIG. 18 illustrates a planar structure of first display pixels formed by light from sub-pixels in a C region without shift after passing a pixel shift unit for the display module in FIG. 16.
Figure 19:
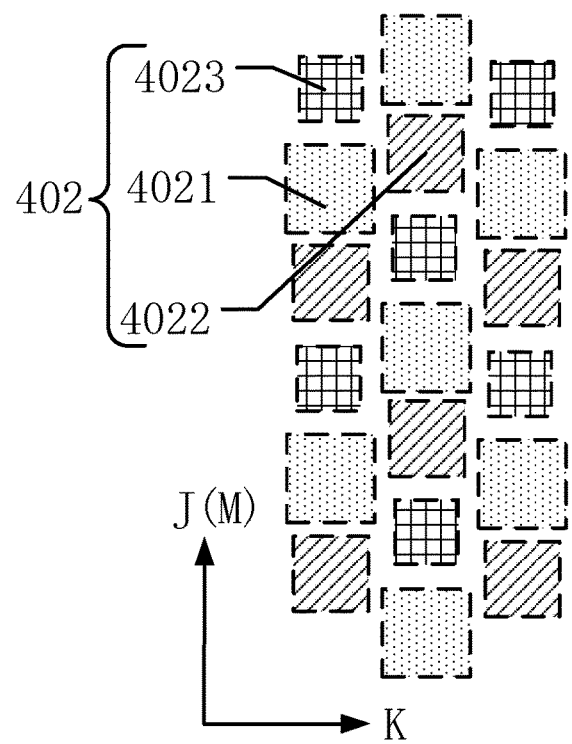
FIG. 19 illustrates a planar structure of second display pixels formed by light from sub-pixels in a C region with shift after passing a pixel shift unit for the display module in FIG. 16.

FIG. 16 illustrates a cross-section view of another exemplary display module consistent with various disclosed embodiments in the present disclosure; FIG. 17 illustrates an exemplary displayed image after the pixel shift unit for the display module in FIG. 16, consistent with various disclosed embodiments in the present disclosure; FIG. 18 illustrates a planar structure of first display pixels formed by light from sub-pixels in an I region without shift after passing a pixel shift unit for the display module in FIG. 16; and FIG. 19 illustrates a planar structure of second display pixels formed by light from sub-pixels in the I region with shift after passing a pixel shift unit for the display module in FIG. 16. (In the figures, sub-pixels of the plurality of sub-pixels 20 with different color are illustrated with different filling patterns. The first display pixels 401 without shift are indicated with solid line frames, and the second display pixels 402 with shift are indicated with broken line frames. A size of the first display pixels 401 and the second display pixels 402 in the figures are for description purposes only, and should not limit scopes of the present disclosure. In various embodiments, the size of the first display pixels 401 and the second display pixels 402 may be configured according to actual demanding.) In one embodiment illustrated in FIGS. 16-19, the plurality of sub-pixels 20 in the display module 000 may include first sub-pixels 201, second sub-pixels 202, and third sub-pixels 203. The first sub-pixels 201, the second sub-pixels 202, and the third pixels 203 may have different color.

The first sub-pixels 201, the second sub-pixels 202, and the third pixels 203 may be arranged alternately along a fifth direction J to form fifth pixel groups 20E. The fifth pixel groups 20E may be arranged sequentially along a sixth direction K.

A shift direction M of the light from the plurality of sub-pixels 20 by the pixel shift unit 30 may be same as the third direction G.

For each fifth pixel group 20E, along the shift direction M, a second display pixel 4021 corresponding to a first sub-pixel 201 may have an orthographic projection on the display panel 10 overlapping an orthographic projection of a first display pixel 4012 corresponding to an adjacent second sub-pixel 202 on the display panel 10; an orthographic projection of a second display pixel 4022 corresponding to a second sub-pixel 202 may overlap an orthographic projection of a first display pixel 4013 with respect to an adjacent third sub-pixel 203 on the display panel 10; and an orthographic projection of a second display pixel 4023 with respect to a third sub-pixel 203 on the display panel 10 may overlap an orthographic projection of a first display pixel 4011 with respect to an adjacent first sub-pixel 201 on the display panel 10.

In the display module of the present disclosure, the first sub-pixels 201, the second sub-pixels 202, and the third pixels 203 may be arranged alternately along the fifth direction J to form the fifth pixel groups 20E. The fifth pixel groups 20E may be arranged sequentially along the sixth direction K. Correspondingly, the display module 000 with the pixels arranged in this configuration may have improved resolution and a less grainy monochromatic image.

In some embodiments illustrated in FIGS. 16-19, the sub-pixels 20 of the plurality of sub-pixels 20 in adjacent fifth pixel groups 50E may be arranged in a misalignment so that one sub-pixel 20 in a fifth pixel groups 50E and all sub-pixels 20 adjacent to the sub-pixel 20 may have different colors.

In the present disclosure, the sub-pixels 20 of the plurality of sub-pixels 20 in adjacent fifth pixel groups 50E may be arranged in a misalignment, that is, the sub-pixels 20 in two adjacent fifth pixel groups 50E may be not arranged in a horizontal line. Correspondingly, a distribution of the plurality of sub-pixels 20 in the display panel 10 may be more homogeneous and an appearance of light only from the first sub-pixels 201, or light only from the second sub-pixels 202, or light only from the third sub-pixels 203, along a linear direction may be avoided. A color shift or appearance of grid patterns when the display panel 10 performs display may be alleviated. The display quality of the display module may be improved.

In some embodiments as illustrated in FIGS. 12-19, the first sub-pixels 201, the second sub-pixels 202, and the third pixels 203 may have same shape and area.

In the present disclosure, the first sub-pixels 201, the second sub-pixels 202, and the third pixels 203 may have the same shape and area. Correspondingly, when the display module displays monochromatic images, the plurality of sub-pixels 20 with three different colors may be distributed more homogeneously in the display panel, and the images may have small grainy.

For description purposes only, in FIGS. 13-15 and FIGS. 17-19, the first display pixel 401 and the second display pixel 402 corresponding to each of the plurality of sub-pixels 20 are indicated with different areas as examples, and should not limit scopes of the present disclosure. In some embodiments, the first sub-pixels 201, the second sub-pixels 202, and the third pixels 203 may have the same shape and area. Correspondingly, the first display pixels 401 and the second display pixels 402 may also have same area.

Figure 20:
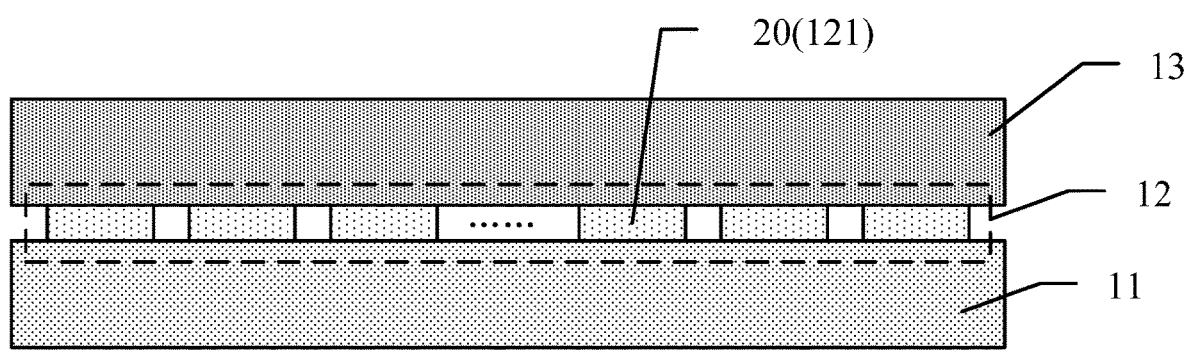
FIG. 20 illustrates a cross-section view of an exemplary display panel consistent with various disclosed embodiments in the present disclosure.

The present disclosure also provides a display panel. As illustrated in FIG. 20, one embodiment of the present disclosure may provide a display panel 10, and the display panel 10 may be an organic light-emitting display panel.

In the present disclosure, by disposing the pixel shift unit 30, for a same sub-pixel 20 of the plurality of sub-pixels, a displayed image (the second display pixel 402) with shift corresponding to the sub-pixel 20 and a displayed image (the first display pixel 401) without shift corresponding to the sub-pixel 20 may not aggregate together. The monochromatic images may be less grainy and the display quality may be improved. This technology may be used in the organic light-emitting display panel. As illustrated in FIG. 20, the organic light-emitting display panel 10 may include an array substrate 11, an organic light-emitting device layer 12 on the array substrate 11, and a packaging layer 13 which packages the organic light-emitting device layer 12. The organic light-emitting device layer 12 may include a plurality of organic light-emitting devices 121 arranged in an array. Each of the plurality of organic light-emitting devices 121 may include a cathode, an anode, and a light-emitting material between the cathode and the anode. When a driving current passes through the cathode and the anode, the light-emitting material may emit light to display. A thin film transistor array may be disposed in the array substrate 11, to form a circuit for providing currents to the cathode and the anode. Each of the plurality of organic light-emitting devices 121 may correspond to one sub-pixel 20 of the plurality of sub-pixels 20. The organic light-emitting device layer 12 may be formed by depositing organic light-emitting materials on the array substrate 11. The resolution of the organic light-emitting display panel may be higher if the arrangement density of the plurality of organic light-emitting devices 121 is higher. However, in the current technologies, a limitation of accuracy of a mask for a vapor deposition process, an alignment deviation, and accuracy of exposure, hinders further increasing of the resolution of the organic light-emitting devices. In the present disclosure, the resolution of the organic light-emitting display panel may be improved and the grainy monochromatic images in the organic light-emitting display panel may be suppressed simultaneously.

The present disclosure also provides a display method for a display module, which may be applied to any display modules provided by the various embodiments of the present disclosure. In one embodiment, the display method where a frame time may at least include a first time and a second time, may include:

at the first time, the plurality of sub-pixels may receive first data signals, the light from the plurality of sub-pixels may pass through the pixel shift unit to form the first display pixels, where the pixel shift unit may not shift the light from the plurality of sub-pixels;

at the second time, the plurality of sub-pixels may receive second data signals, the light from the plurality of sub-pixels may pass through the pixel shift unit to form the second display pixels, where the pixel shift unit may shift the light from the plurality of sub-pixels; and in a frame time, the first display pixels and the second display pixels may form a frame image together.

In the display method for a display module provided by the present disclosure, for each sub-pixel of the plurality of sub-pixels, the sub-pixel may receive the first data signals, the light from the sub-pixel may pass through the pixel shift unit without shift by the pixel shift unit to form the first display pixel at the first time; and the sub-pixel may receive the second data signals, the light from the sub-pixel may pass through the pixel shift unit with shift by the pixel shift unit to form the second display pixel at the second time. For each sub-pixel of the plurality of sub-pixels, the first display pixel and the second display pixel may not overlap. For each sub-pixel of the plurality of sub-pixels, an orthographic projection of the second display pixel with respect to the sub-pixel on the display panel may overlap an orthographic projection of the first display pixel with respect to at least one adjacent sub-pixel of the plurality of sub-pixels on the display panel. Correspondingly, the pixel shift unit may change the polarization of the light emitted by the display panel at different time, and induce different shift of the light paths. A same sub-pixel of the plurality of sub-pixels may be displayed at different position at different time and may not interfere each other. A frame time may include at least the first time and the second time, and an interval between the first time and the second time may be short. The display images at two different time may be considered as a video or an animation effect visually. The first display pixels and the second display pixels may form a frame image together. The monochromatic images may be less grainy and the visual resolution may be improved. The resolution of the display module and the display quality may be improved then.

Figure 21:
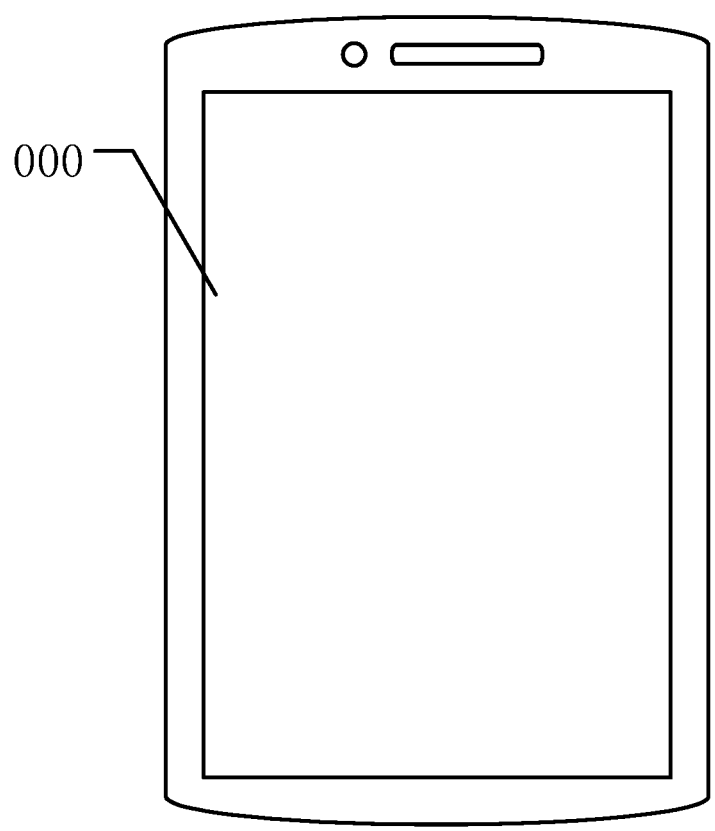
FIG. 21 illustrates an exemplary display device consistent with various disclosed embodiments in the present disclosure.

The present disclosure also provides a display device 111 illustrated in FIG. 21. The display device 111 may include a display module 000 provided by various embodiments of the present disclosure. For description purposes only, the embodiment illustrated in FIG. 21 where the display device 111 is a cell phone is used as an example to illustrate the present disclosure and should not limit the scopes of the present disclosure. In various embodiments, the display device 111 may be a computer, a vehicle display device, or another display device with a display function. The display device 111 may have advantages of the display module 000 provided by various embodiments of the present disclosure, and can be referred to the previous illustration.

In the present disclosure, the pixel shift unit may be disposed in the display module provided by the present disclosure. For a sub-pixel of the plurality of sub-pixels, at the first time, the light emitted by the sub-pixel may not be shifted by the pixel shift unit and may form a first display pixel; at a second time, the light emitted by the sub-pixel may be shifted by the pixel shift unit to form a second display pixel. For a sub-pixel of the plurality of sub-pixels, the first display pixel may not overlap the second display pixel, correspondingly the displayed image (the second display pixel) formed through the sub-pixel shifted by the pixel shift unit and the displayed image (the first display pixel) formed through the sub-pixel not shifted by the pixel shift unit may not aggregate together. The grainy monochromatic images may be reduced, and the display quality may be improved. For a sub-pixel of the plurality of sub-pixels, an orthographic projection of the second display pixel with respect to the sub-pixel overlaps an orthographic projection of the first display pixel with respect to at least one sub-pixel of the plurality of sub-pixels adjacent to the sub-pixel. Correspondingly, the pixel shift unit may change the polarization of the light emitted by the display panel at different time, and then induce different shift in the light paths. A same sub-pixel of the plurality of sub-pixels in the display panel may be displayed in different positions at different time and the displayed images may not interfere each other. Since the interval between the first time and the second time may be small, the displayed images at the two different time may be continuous and may be considered as a video or animation effect visually. Correspondingly, the grainy monochromatic images may be reduced and the visual resolution may be improved simultaneously. The resolution and the display quality of the display module may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A display module, comprising:
a display panel including a plurality of sub-pixels; and
a pixel shift unit, disposed at a side of a light-exiting surface of the display panel, wherein light emitted by the plurality of sub-pixels exits after passing through the pixel shift unit;
wherein:
for a sub-pixel of the plurality of sub-pixels:
at a first time, the pixel shift unit does not shift the light emitted by the sub-pixel, and after the light emitted by the sub-pixel passing through the pixel shift unit, a first display pixel is formed corresponding to the sub-pixel at the first time, and
at a second time, the pixel shift unit shifts the light emitted by the sub-pixel, and after the light emitted by the sub-pixel passing through the pixel shift unit, a second display pixel is formed corresponding to the sub-pixel at the second time, wherein the second display pixel does not overlap the first display pixel;
an orthographic projection of the second display pixel corresponding to the sub-pixel overlaps an orthographic projection of a first display pixel of at least one adjacent sub-pixel of the plurality of sub-pixels;
for the first display pixel and second display pixel having overlapped orthographic projections, the orthographic projection of the first display pixel is located inside the orthographic projection of the second display pixel, or the orthographic projection of the second display pixel is located inside the orthographic projection of the first display pixel; and
for the first display pixel and second display pixel having overlapped orthographic projections, a sub-pixel of the plurality of sub-pixels, corresponding to the first display pixel, and another sub-pixel of the plurality of sub-pixels, corresponding to the second display pixel, have different colors.

2. The display module according to claim 1, wherein:
the pixel shift unit at least includes a birefringent layer and a light valve, wherein the light valve is disposed between the display panel and the birefringent layer.

3. The display module according to claim 1, wherein:
an interval between the first time and the second time is smaller than or equal to about 100 ms.

4. The display module according to claim 1, wherein:
the plurality of sub-pixels includes first sub-pixels, second sub-pixels, and third sub-pixels, wherein the first sub-pixels, the second sub-pixels, and the third sub-pixels have different colors;
the first sub-pixels are arranged along a first direction to form first pixel groups;
the second sub-pixels and the third sub-pixels are arranged alternately along the first direction to form second pixel groups;
the first pixel groups and the second pixel groups are arranged alternately along a second direction intersecting the first direction;
the pixel shift unit shifts the light emitted by the plurality of sub-pixels along a shift direction, wherein the shift direction is a same as the second direction;
for the first pixel groups and the second pixel groups arranged alternately along the second direction and adjacent to each other, an orthographic projection of a second display pixel corresponding to one first sub-pixel on the display panel covers: an orthographic projection of a first display pixel corresponding to one second sub-pixel on the display panel and an orthographic projection of a first display pixel corresponding to a third sub-pixel adjacent to the one second sub-pixel on the display panel;
for the second pixel groups and the first pixel groups arranged alternately along the second direction and adjacent to each other, an orthographic projection of a second display pixel corresponding to one second sub-pixel on the display panel and an orthographic projection of a second display pixel corresponding to a third sub-pixel adjacent to the one second sub-pixel on the display panel are located inside an orthographic projection of a first display pixel corresponding to a first sub-pixel on the display panel;
a second display pixel correspondint to one first sub-pixel, a first display pixel corresponding to one second sub-pixel, and a first display pixel corresponding to one third sub-pixel whose orthographic projections overlap each other, form a display pixel unit; and
a first display pixel correspondint to one first sub-pixel, a second display pixel correspondint to one second sub-pixel, and a second display pixel correspondint to one third sub-pixel whose orthographic projections overlap each other, form another display pixel unit.

5. The display module according to claim 4, wherein:
the first sub-pixels are blue sub-pixels, the second sub-pixels are red sub-pixels, and the third sub-pixels are green sub-pixels.

6. The display module according to claim 4, wherein:
the first sub-pixels are blue sub-pixels, the second sub-pixels are green sub-pixels, and the third sub-pixels are red sub-pixels.

7. The display module according to claim 1, wherein:
the plurality of sub-pixels includes first sub-pixels, second sub-pixels, and third sub-pixels, wherein the first sub-pixels, the second sub-pixels, and the third sub-pixels have different colors;
the first sub-pixels and a portion of the second sub-pixels are arranged alternately along a third direction to form third pixel groups;
another portion of the second sub-pixels and the third sub-pixels are arranged alternately along the third direction to form fourth pixel groups;
the third pixel groups and the fourth pixel groups are arranged alternately along a fourth direction crossing the third direction;
the pixel shift unit shifts the light emitted by the plurality of sub-pixels along a shift direction, wherein the shift direction is same as the third direction;
for one of the third pixel groups, along the shift direction, an orthographic projection of a second display pixel correspondint to one first sub-pixel on the display panel overlaps an orthographic projection of a first display pixel correspondint to one second sub-pixel adjacent to the one first sub-pixel on the display panel, and an orthographic projection of a second display pixel correspondint to one second sub-pixel on the display panel overlap an orthographic projection of a first display pixel correspondint to one first sub-pixel adjacent to the one second sub-pixel on the display panel; and for one of the fourth pixel groups, along the shift direction, an orthographic projection of a second display pixel correspondint to one second sub-pixel on the display panel overlaps an orthographic projection of a first display pixel correspondint to one third sub-pixel adjacent to the one second sub-pixel on the display panel, and an orthographic projection of a second display pixel correspondint to one third sub-pixel on the display panel overlap an orthographic projection of a first display pixel correspondint to one second sub-pixel adjacent to the one third sub-pixel on the display panel.

8. The display module according to claim 7, wherein:
along the fourth direction, two adjacent sub-pixels of the plurality of sub-pixels have different colors.

9. The display module according to claim 7, wherein:
the first sub-pixels are blue sub-pixels, the second sub-pixels are green sub-pixels, and the third sub-pixels are red sub-pixels.

10. The display module according to claim 7, wherein:
the first sub-pixels, the second sub-pixels, and the third sub-pixels have an approximately same shape and same area.

11. The display module according to claim 1, wherein:
the plurality of sub-pixels includes first sub-pixels, second sub-pixels, and third sub-pixels, wherein the first sub-pixels, the second sub-pixels, and the third sub-pixels have different colors;
the first sub-pixels, the second sub-pixels, and the third sub-pixels are arranged alternately along a fifth direction to form fifth pixel groups;
the fifth pixel groups are arranged sequentially along a sixth direction crossing the fifth direction;
the pixel shift unit shifts the light emitted by the plurality of sub-pixels along a shift direction, wherein the shift direction is same as the fifth direction; and
for one of the fifth pixel groups, along the shift direction, an orthographic projection of a second display pixel correspondint to one first sub-pixel on the display panel overlaps an orthographic projection of a first display pixel correspondint to one second sub-pixel adjacent to the one first sub-pixel on the display panel, and an orthographic projection of a second display pixel correspondint to one second sub-pixel on the display panel overlap an orthographic projection of a first display pixel correspondint to one third sub-pixel adjacent to the one second sub-pixel on the display panel; and an orthographic projection of a second display pixel correspondint to one third sub-pixel on the display panel overlap an orthographic projection of a first display pixel correspondint to one first sub-pixel adjacent to the one third sub-pixel on the display panel.

12. The display module according to claim 11, wherein:
sub-pixels of the plurality of sub-pixels in adjacent fifth pixel groups are arranged in a misalignment; and
a color of each sub-pixel of the plurality of sub-pixels is different from colors of sub-pixels of the plurality of sub-pixels adjacent to the sub-pixel.

13. The display module according to claim 11, wherein:
the first sub-pixels, the second sub-pixels, and the third sub-pixels have an approximately same shape and same area.

14. The display module according to claim 1, wherein:
the display panel is an organic light-emitting display panel.

15. A display method of a display module, the display module comprising a display panel with a plurality of sub-pixels and a pixel shift unit at a side of a light-exiting surface of the display panel, wherein light emitted by the plurality of sub-pixels exits after passing through the pixel shift unit, the method comprising:
at a first time, the plurality of sub-pixels receiving first data signals, wherein the pixel shift unit does not shift the light emitted by the plurality of sub-pixels, and the light emitted by the plurality of sub-pixels forms first display pixels after passing through the pixel shift unit;
at a second time, the plurality of sub-pixels receiving second data signals, wherein the pixel shift unit shifts the light emitted by the plurality of sub-pixels, and the light emitted by the plurality of sub-pixels forms second display pixels after passing through the pixel shift unit; and
in one frame time that at least includes the first time and second time, the first display pixels and the second display pixels forming a frame of image together.

16. The display device, comprising:
a display module, including:
a display panel, including a plurality of sub-pixels; and
a pixel shift unit, disposed at a side of a light-exiting surface of the display panel, wherein light emitted by the plurality of sub-pixels exits after passing through the pixel shift unit;
wherein:
for a sub-pixel of the plurality of sub-pixels:
at a first time, the pixel shift unit does not shift the light emitted by the sub-pixel, and after the light emitted by the sub-pixel passing through the pixel shift unit, a first display pixel is formed corresponding to the sub-pixel at the first time, and
at a second time, the pixel shift unit shifts the light emitted by the sub-pixel, and after the light emitted by the sub-pixel passing through the pixel shift unit, a second display pixel is formed corresponding to the sub-pixel at the second time, wherein the second display pixel does not overlap the first display pixel; an orthographic projection of the second display pixel corresponding to the sub-pixel overlaps an orthographic projection of a first display pixel of at least one adjacent sub-pixel of the plurality of sub-pixels;
for the first display pixel and second display pixel having overlapped orthographic projections, the orthographic projection of the first display pixel is located inside the orthographic projection of the second display pixel, or the orthographic projection of the second display pixel is located inside the orthographic projection of the first display pixel; and
for the first display pixel and second display pixel having overlapped orthographic projections, a sub-pixel of the plurality of sub-pixels, corresponding to the first display pixel, and another sub-pixel of the plurality of sub-pixels, corresponding to the second display pixel, have different colors.

* * * * *